(12) United States Patent
Abdulaziz et al.

(10) Patent No.: US 12,040,803 B2
(45) Date of Patent: Jul. 16, 2024

(54) DEVICES AND METHOD FOR FREQUENCY DETERMINATION

(71) Applicant: Telefonaktiebolaget LM Ericsson (publ), Stockholm (SE)

(72) Inventors: Mohammed Abdulaziz, Lund (SE); Henrik Sjöland, Lund (SE); Tony Påhlsson, Lund (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 43 days.

(21) Appl. No.: 18/001,618

(22) PCT Filed: Jun. 17, 2020

(86) PCT No.: PCT/EP2020/066711
§ 371 (c)(1),
(2) Date: Dec. 13, 2022

(87) PCT Pub. No.: WO2021/254606
PCT Pub. Date: Dec. 23, 2021

(65) Prior Publication Data
US 2023/0223943 A1 Jul. 13, 2023

(51) Int. Cl.
H03L 7/085 (2006.01)
G04F 10/00 (2006.01)
H03M 1/12 (2006.01)

(52) U.S. Cl.
CPC ............ H03L 7/085 (2013.01); G04F 10/005 (2013.01); H03M 1/12 (2013.01)

(58) Field of Classification Search
CPC .................. G04F 10/005; H03L 7/0085; H03L 7/0087; H03L 7/091
See application file for complete search history.

(56) References Cited

U.S. PATENT DOCUMENTS 7,928,888 B1 * 4/2011 Chiu ...................... G04F 10/005
　　　　　　　　　　　　　　　　　　　　341/161
8,981,974 B2 * 3/2015 Chaivipas ............... H03M 1/50
　　　　　　　　　　　　　　　　　　　　341/118

(Continued)

FOREIGN PATENT DOCUMENTS

EP　　　　2402772 A1　　1/2012
WO　　2021185430 A1　　9/2021

OTHER PUBLICATIONS

International Search Report and Written Opinion dated Mar. 22, 2021 for International Application No. PCT/EP2020/066711 filed on Jun. 17, 2020, consisting of 9 pages.

(Continued)

*Primary Examiner* — Thomas J. Hiltunen
(74) *Attorney, Agent, or Firm* — Weisberg I.P. Law, P.A.

(57) ABSTRACT

A frequency determination device for determining a frequency relationship between a reference signal and a clock signal. Each constituent TDC is configured to provide a digitally represented constituent output signal in response to receiving a constituent reference signal and a constituent clock signal, and the frequency determination device is configured to successively provide respectively delayed versions of the constituent clock signal of a first constituent TDC as respective constituent clock signals to the other constituent TDC:s. The reference signal provider is configured to provide the respective constituent reference. The switching circuitry is configured to provide the reference signal as the constituent clock signal to the first constituent TDC. The determination circuitry is configured to determine a number of consecutively same-valued symbols in a concatenation of the digitally represented constituent output signals of the constituent TDC:s, and to determine the frequency relationship.

25 Claims, 6 Drawing Sheets

(56) References Cited

U.S. PATENT DOCUMENTS

| | | | | |
|---|---|---|---|---|
| 9,897,975 | B2* | 2/2018 | Salle | H03M 1/1009 |
| 9,984,732 | B2* | 5/2018 | Seomun | G11C 7/1012 |
| 9,989,928 | B2* | 6/2018 | Wu | G04F 10/005 |
| 10,496,040 | B2* | 12/2019 | Salle | G01S 7/032 |
| 10,840,916 | B2* | 11/2020 | Ravi | H03L 7/0995 |
| 10,951,199 | B1* | 3/2021 | Jung | H03K 5/133 |
| 11,043,940 | B1* | 6/2021 | Brochado Reis | H03K 19/20 |
| 11,563,441 | B2* | 1/2023 | Monk | H03L 7/23 |
| 11,868,094 | B2* | 1/2024 | Abdulaziz | H03L 7/0818 |
| 2005/0195917 | A1* | 9/2005 | Staszewski | H03C 3/0941 |
| | | | | 375/295 |
| 2018/0115406 | A1 | 4/2018 | Moore et al. | |
| 2022/0385280 | A1* | 12/2022 | Gizdarski | H03K 5/131 |

OTHER PUBLICATIONS

Wu, Ying et al., A 3.5-6.8GHz Wide-bandwidth DTC-assisted Franctional-N All-digital PLL with a Mash ΔΣ TDC for Low In-Band Phase Noise; IEEE Xplore, 2016, consisting of 4 pages.

Lu, Ping et al., A 3.6 mW, 90 nm CMOS Gated-Vernier Time-to-Digital Converter With an Equivalent Resolution of 3.2 ps; IEEE Journal of Solid-State Circuits, vol. 47, No. 7, May 1, 2021, consisting of 10 pages.

Straayer, Matthew Z. et al., A Multi-Path Gated Ring Oscillator TDC With First-Order Noise Shaping; IEEE Journal of Solid-State Circuits, vol. 44 No. 4, Mar. 25, 2009, consisting of 10 pages.

\* cited by examiner (a)

(b)

(c)

(d)

(e)

(f)

DEVICES AND METHOD FOR FREQUENCY DETERMINATION

CROSS-REFERENCE TO RELATED APPLICATIONS

This application is a Submission Under 35 U.S.C. § 371 for U.S. National Stage Patent Application of International Application Number: PCT/EP2020/066711, filed Jun. 17, 2020 entitled "DEVICES AND METHOD FOR FREQUENCY DETERMINATION," the entirety of which is incorporated herein by reference.

TECHNICAL FIELD

The present disclosure relates generally to the field of frequency determination. More particularly, it relates to determination of a frequency relationship between a reference signal and another signal.

BACKGROUND

There are numerous situations when it is needed or desirable to determine a frequency relationship between a reference signal and another signal. Examples include frequency-locked loop (FLL) scenarios, analog-to-digital converter (ADC) applications, and the frequency acquisition stage of phase-locked loop (PLL) scenarios.

Many frequency determination approaches experience one or more of the following (or other) problems/drawbacks: that the accuracy is lower than desired, that the maximum resolution is lower than desired, that the maximum range is lower than desired, that the minimum detectable frequency is higher than desired, that the maximum period of the reference signal is lower than desired, and that the implementation complexity and/or size is higher than desired. Furthermore, separate frequency detecting circuitry is often needed to properly implement the frequency acquisition stage of phase-locked loops.

Therefore, there is a need for alternative approaches to frequency determination.

SUMMARY

It should be emphasized that the term "comprises/comprising" (replaceable by "includes/including") when used in this specification is taken to specify the presence of stated features, integers, steps, or components, but does not preclude the presence or addition of one or more other features, integers, steps, components, or groups thereof. As used herein, the singular forms "a", "an" and "the" are intended to include the plural forms as well, unless the context clearly indicates otherwise.

Generally, when an arrangement is referred to herein, it is to be understood as a physical product; e.g., an apparatus. The physical product may comprise one or more parts, such as controlling circuitry in the form of one or more controllers, one or more processors, or the like.

It is an object of some embodiments to solve or mitigate, alleviate, or eliminate at least some of the above or other disadvantages.

A first aspect is a frequency determination device for determining a frequency relationship between a reference signal and a clock signal. The frequency determination device comprises a plurality of constituent time-to-digital converters (TDC:s), a reference signal provider, switching circuitry, and determination circuitry.

Each constituent TDC is configured to provide a digitally represented constituent output signal in response to receiving a constituent reference signal and a constituent clock signal. The frequency determination device is configured to successively provide respectively delayed versions of the constituent clock signal of a first constituent TDC as respective constituent clock signals to the other constituent TDC:s.

The reference signal provider is configured to provide the respective constituent reference signals to each of the constituent TDC:s, wherein each respective constituent reference signal comprises a delayed version of the reference signal.

The switching circuitry is configured to provide the reference signal as the constituent clock signal to the first constituent TDC during a first stage, and to provide the clock signal as the constituent clock signal to the first constituent TDC during a second stage.

The determination circuitry is configured to determine a number of consecutively same-valued symbols in a concatenation of the digitally represented constituent output signals of the constituent TDC:s, and to determine the frequency relationship based on the number determined during the first stage and the number determined during the second stage.

In some embodiments, the reference signal provider is configured to provide the delayed version of the reference signal with an equal delay for each respective constituent reference signal.

In some embodiments, the reference signal provider comprises one or more reference signal delay components of equal delay connected in series for providing the delayed version of the reference signal. Each of the reference signal delay components corresponds to one or more clock signal delay components configured to provide the respective constituent clock signals to the constituent TDC:s. In such embodiments, the determination circuitry may be further configured to determine the delay of a reference signal delay component based on a number of initial consecutively same-valued symbols in the concatenation of the digitally represented constituent output signals during the first stage.

In some embodiments, the determination circuitry is configured to determine the frequency relationship further based on the determined delay of a reference signal delay component.

In some embodiments, the reference signal provider is configured to provide the delayed version of the reference signal by successively increasing the delay for each respective constituent reference signal.

In some embodiments, the reference signal provider comprises a plurality of reference signal delay components. At least some of the reference signal delay components correspond to respective clock signal delay components configured to provide the respective constituent clock signals to the constituent TDC:s. For each respective constituent reference signal, a respective subset of the plurality of reference signal delay components—connected in series—is configured to provide the delayed version of the reference signal.

In some embodiments, the frequency relationship is a ratio between the reference signal frequency and the clock signal frequency.

In some embodiments, the determination circuitry is configured to determine the frequency relationship as a multiplicity between the number of consecutively same-valued symbols determined during the first stage and the number of consecutively same-valued symbols determined during the second stage.

In some embodiments, the switching is further configured to provide the reference signal as the constituent clock signal to the first constituent TDC during a first part of the first stage, and to provide an inverted version of the reference signal as the constituent clock signal to the first constituent TDC during a second part of the first stage.

In some embodiments, the number of consecutively same-valued symbols is an average number of consecutively same-valued symbols in the concatenation of the digitally represented constituent output signals.

In some embodiments, the number of consecutively same-valued symbols is exclusive of initial and/or terminal consecutively same-valued symbols in the concatenation of the digitally represented constituent output signals.

In some embodiments, each constituent TDC comprises a plurality of delay elements arranged in sequence to successively delay the constituent clock signal, and a corresponding plurality of output ports. Each output port is configured to—when triggered by the constituent reference signal—provide an output of one of the delay elements as a symbol of the digitally represented constituent output signal.

A second aspect is a time-to-digital converter (TDC) circuitry for converting a phase difference between an input reference signal and an input clock signal to a digitally represented output signal. The TDC circuitry comprises the frequency determination device of the first aspect, wherein the reference signal is the input reference signal, and the clock signal is the input clock signal, and wherein each constituent TDC is further configured to convert a phase difference between the constituent reference signal and the constituent clock signal to the digitally represented constituent output signal.

In some embodiments, the reference signal provider is configured to provide—in at least a parallel operation mode of the TDC circuitry—the respective constituent reference signals to each of the constituent TDC:s with different respective delays for at least two of the respective constituent reference signals.

In some embodiments, the reference signal provider is configured to provide—in at least the parallel operation mode of the TDC circuitry—the respective constituent reference signals as respectively delayed versions of the input reference signal with the respective delays being randomly distributed.

In some embodiments, the TDC circuitry is—in the parallel operation mode of the TDC circuitry—configured to provide the input clock signal as the respective constituent clock signal to each of the constituent TDC:s.

In some embodiments, at least some constituent TDC:s are configured to provide respectively delayed versions of the input clock signal.

In some embodiments, the TDC circuitry is—in a serial operation mode of the TDC circuitry—configurable to operate as the frequency determination device of the first aspect.

In some embodiments, the TDC circuitry further comprises a mode selection signal input configured to control one or more of: provision of the respective constituent clock signal, and provision of the constituent reference signal.

A third aspect is a phase locked loop (PLL) comprising the TDC circuitry of the second aspect.

A fourth aspect is a frequency-locked loop (FLL) comprising the frequency determination device of the first aspect and/or the TDC circuitry of the second aspect.

In some embodiments, the reference signal is an input signal of the frequency-locked loop and the clock signal is a feedback signal of the frequency-locked loop.

A fifth aspect is an analog-to-digital converter (ADC) comprising a voltage-controlled oscillator (VCO) and the frequency determination device of the first aspect.

A sixth aspect is a communication device comprising the frequency determination device of the first aspect and/or the TDC circuitry of the second aspect.

A seventh aspect is a method for determining a frequency relationship between a reference signal and a clock signal.

The method comprises providing respective constituent reference signals to each of a plurality of constituent time-to-digital converters (TDC:s), wherein each respective constituent reference signal comprises a delayed version of the reference signal, wherein each constituent TDC is configured to provide a digitally represented constituent output signal in response to receiving the constituent reference signal and a constituent clock signal.

The method also comprises providing the constituent clock signal to a first constituent TDC, wherein the reference signal is provided as the constituent clock signal during a first stage and the clock signal is provided as the constituent clock signal during a second stage, and successively providing respectively delayed versions of the constituent clock signal of the first constituent TDC as respective constituent clock signals to the other constituent TDC:s.

Furthermore, the method comprises determining the frequency relationship based on a number of consecutively same-valued symbols in a concatenation of the digitally represented constituent output signals of the constituent TDC:s determined during the first stage and a number of consecutively same-valued symbols in the concatenation of the digitally represented constituent output signals of the constituent TDC:s determined during the second stage.

In some embodiments, any of the above aspects may additionally have features identical with or corresponding to any of the various features as explained above for any of the other aspects.

Generally, one or more (e.g., each) of the plurality of constituent TDC:s may be a delay-line based TDC.

An advantage of some embodiments is that alternative approaches to frequency determination are provided.

An advantage of some embodiments is that approaches are provided for determining a frequency relationship between a reference signal and another signal.

An advantage of some embodiments is that frequency determination approaches are provided that are particularly suitable for frequency-locked loop (FLL) scenarios and/or the frequency acquisition stage of phase-locked loop (PLL) scenarios.

An advantage of some embodiments is that the accuracy of frequency determination may be improved (e.g., increased) compared to other frequency determination approaches.

An advantage of some embodiments is that the resolution of frequency determination may be improved (e.g., increased) compared to other frequency determination approaches.

An advantage of some embodiments is that the range of frequency determination may be improved (e.g., increased) compared to other frequency determination approaches.

An advantage of some embodiments is that the minimum detectable frequency of frequency determination may be improved (e.g., decreased) compared to other frequency determination approaches.

An advantage of some embodiments is that the maximum possible period of the reference signal may be improved (e.g., increased) compared to other frequency determination approaches. Put differently, an advantage of some embodiments is that the minimum possible frequency of the reference signal may be improved (e.g., decreased) compared to other frequency determination approaches.

An advantage of some embodiments is that the implementation complexity and/or size of frequency determination implementation may be improved (e.g., decreased) compared to other frequency determination approaches.

An advantage of some embodiments is that approaches are provided which eliminate the need for separate frequency detecting circuitry for the frequency acquisition stage of phase-locked loops.

An advantage of some embodiments is that the robustness (e.g., against mismatch and/or parameter variations) of frequency determination may be improved (e.g., increased) compared to other frequency determination approaches.

BRIEF DESCRIPTION OF THE DRAWINGS

Further objects, features and advantages will appear from the following detailed description of embodiments, with reference being made to the accompanying drawings. The drawings are not necessarily to scale, emphasis instead being placed upon illustrating the example embodiments.

DETAILED DESCRIPTION

As already mentioned above, it should be emphasized that the term "comprises/comprising" (replaceable by "includes/including") when used in this specification is taken to specify the presence of stated features, integers, steps, or components, but does not preclude the presence or addition of one or more other features, integers, steps, components, or groups thereof. As used herein, the singular forms "a", "an" and "the" are intended to include the plural forms as well, unless the context clearly indicates otherwise.

Embodiments of the present disclosure will be described and exemplified more fully hereinafter with reference to the accompanying drawings. The solutions disclosed herein can, however, be realized in many different forms and should not be construed as being limited to the embodiments set forth herein.

In the following, embodiments will be described where approaches to frequency determination are provided.

Generally, one example of a frequency determination device is a frequency-to-digital converter (FDC).

Figure 1:
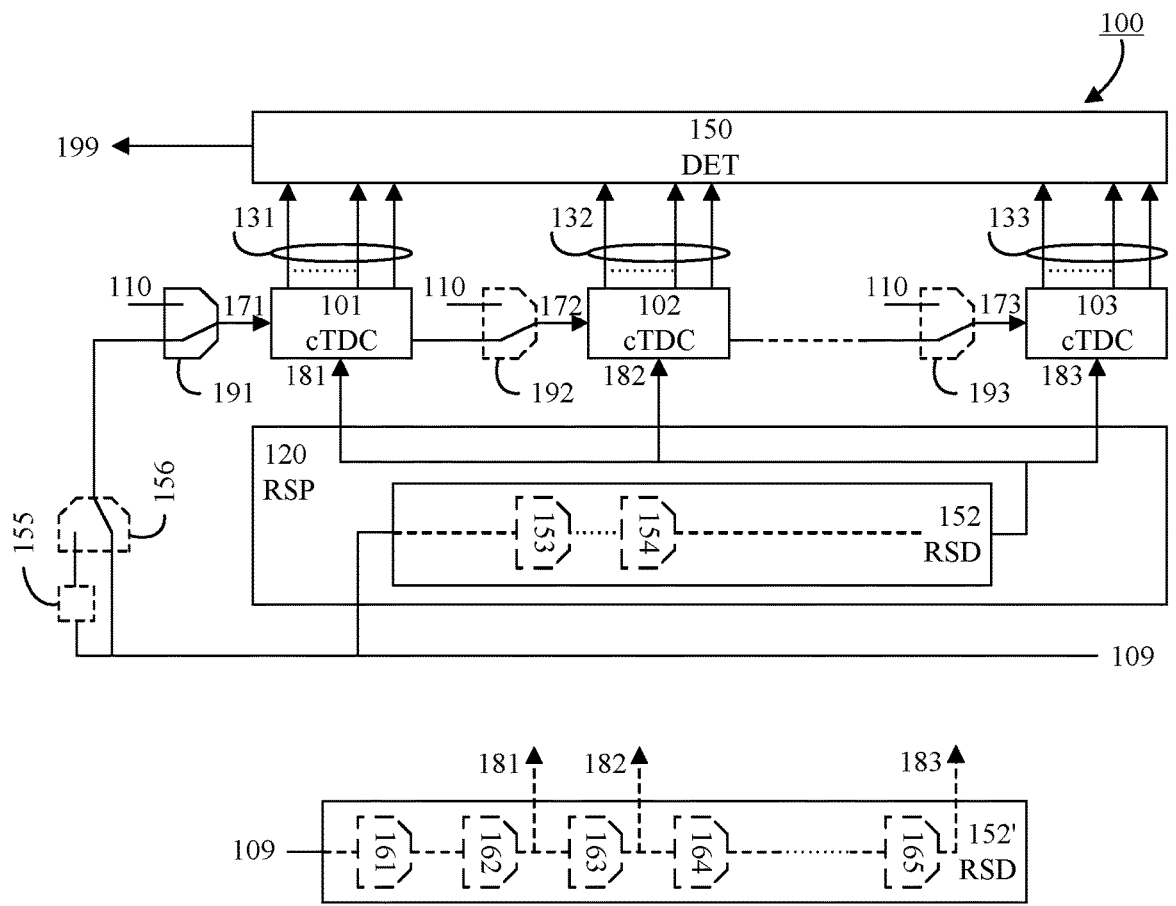
FIG. 1 is a schematic block diagram illustrating an example frequency determination device according to some embodiments.

FIG. 1 schematically illustrates an example frequency determination device 100 according to some embodiments. The frequency determination device 100 is suitable for determining (e.g., configured to determine) a frequency relationship between a reference signal (REF) 109 and a clock signal (CLK) 110. The frequency relationship may be indicated by an output signal 199.

The frequency determination device 100 may, for example, be comprised in one or more of: a phase locked loop (PLL), a frequency-locked loop (FLL), an analog-to-digital converter (ADC), and a communication device (e.g., a wireless communication device, such as a radio access node or a user equipment, UE).

When the frequency determination device 100 is for a frequency-locked loop, the reference signal 109 may be an input signal of the frequency-locked loop and the clock signal 110 may be a feedback signal of the frequency-locked loop.

Alternatively or additionally, when the frequency determination device 100 is for a frequency-locked loop, the frequency relationship indicated by the output signal 199 may be used to control an oscillator (e.g., a voltage controller oscillator) of the FLL to enable frequency locking.

For example, an FLL may be formed according to any suitable approach, wherein the frequency relationship (e.g., a frequency ratio) is compared to a target value and the difference is fed to a controller (e.g., a loop filter) that adjusts a control signal for a digitally controlled oscillator.

Figure 3:
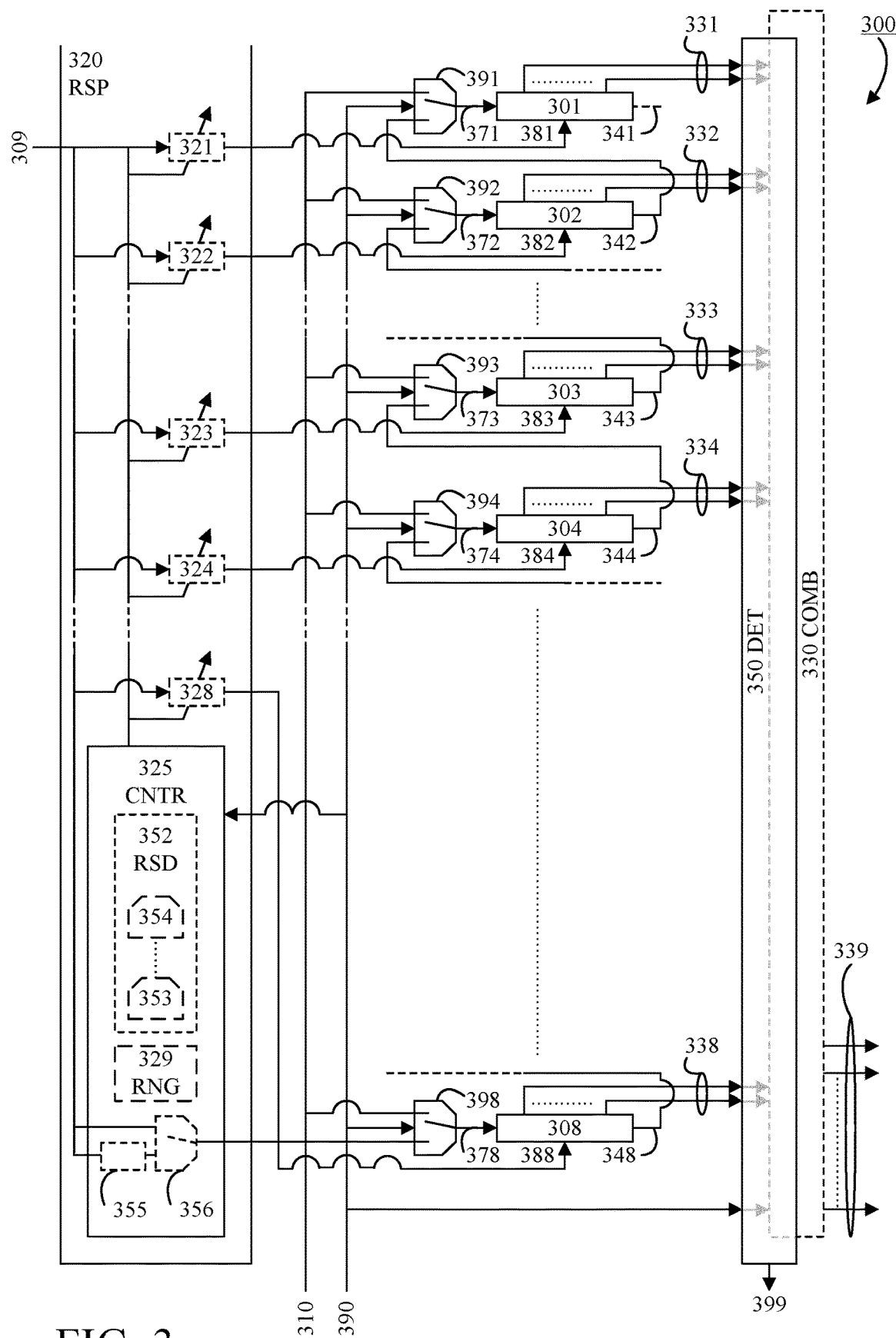
FIG. 3 is a schematic block diagram illustrating an example frequency determination device according to some embodiments.

In some embodiments, the frequency determination device 100 is implemented using a TDC circuitry architecture, which will be further exemplified in connection with FIG. 3.

The frequency determination device 100 comprises a plurality of constituent time-to-digital converters (cTDC) 101, 102, 103, a reference signal provider (RSP; e.g., reference signal providing circuitry or a reference signal provision module) 120, switching circuitry represented by a switch (e.g., implemented with a multiplexer, MUX) 191, and determination circuitry (DET; e.g., a determiner or a determination module) 150.

Figure 2:
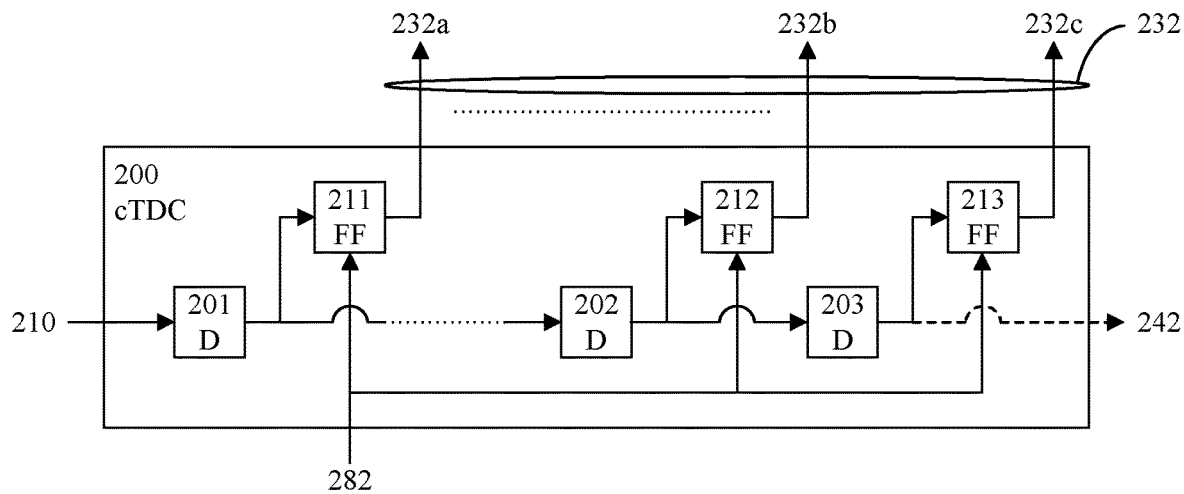
FIG. 2 is a schematic block diagram illustrating an example constituent TDC according to some embodiments.

The plurality of constituent TDC:s 101, 102, 103 may be delay-line based TDC:s, which will be exemplified further in connection with FIG. 2. It should be noted, however, that using the delay-line based TDC:s illustrated in FIG. 2 as constituent TDC:s is merely meant as an illustrative example. Generally, any type of delay-line based TDC (e.g., a Vernier line TDC) may be used, wherein feeding a low frequency signal (e.g., the reference signal) to the TDC during a first stage and feeding a high frequency signal (e.g., the clock signal) to the TDC during a second stage, and comparing the resulting outputs, enables provision of an indication of the multiplication ratio between the frequencies.

Each constituent TDC 101, 102, 103 is configured to provide a digitally represented constituent output signal 131, 132, 133 in response to receiving a constituent reference signal 181, 182, 183 and a constituent clock signal 171, 172, 173.

As illustrated in FIG. 1, the switch 191 is configured to provide the constituent clock signal 171 to the first constituent TDC 101. The switch 191 is configured to provide either of the reference signal 109 and the clock signal 110 as the constituent clock signal 171 of the first constituent TDC 101. Typically, the switch is configured to provide the reference signal 109 as the constituent clock signal 171 to the first constituent TDC 101 during a first stage, and to provide the clock signal 110 as the constituent clock signal 171 to the first constituent TDC 101 during a second stage.

The first and second stages may, for example, be defined as respective first and second durations in time. The first stage may be a duration of time suitable for (e.g., needed to) determine an indication of the reference signal frequency. The second stage may be a duration of time suitable for (e.g., needed to) determine an indication of the clock signal frequency.

The frequency determination device 100 is configured to successively provide respectively delayed versions of the constituent clock signal 171 of the first constituent TDC 101 as respective constituent clock signals 172, 173 to the other constituent TDC:s 102, 103. The delay of the respectively delayed versions of the constituent clock signal 171 may be successively provided by the constituent TDC:s, and possibly by further delay elements (clock signal delay components) in the chain of constituent TDC:s.

As will be further exemplified in connection with FIG. 3, the successive provision of respectively delayed versions of the constituent clock signal 171 of the first constituent TDC 101 as respective constituent clock signals 172, 173 to the other constituent TDC:s 102, 103 may be implemented by operating a TDC circuitry in a serial operation mode.

In such embodiments, the frequency determination device 100 may comprise respective switching circuitries (e.g., implemented with respective multiplexers) 192, 193 configured to provide the constituent clock signals 172, 173 to the other constituent TDC:s 102, 103. The respective switching circuitries 192, 193 is an example of further delay elements (clock signal delay components) in the chain of constituent TDC:s.

The respective switching circuitries 192, 193 may be configured to provide either of the clock signal 110 and the respectively delayed versions of the constituent clock signal 171 of the first constituent TDC as constituent clock signals 172, 173 to the other constituent TDC:s 102, 103.

Typically, the switching circuitries 191, 192, 193 are configured to provide the clock signal 110 as the constituent clock signals 171, 172, 173 to all of the constituent TDC:s 101, 102, 103 in a parallel operation mode of the TDC circuitry. Also typically, the switching circuitries 192, 193 are configured to provide the respectively delayed versions of the constituent clock signal 171 of the first constituent TDC as the constituent clock signals 172, 173 to the other (all but the first) constituent TDC:s 102, 103 in a serial operation mode of the TDC circuitry.

The reference signal provider (RSP) 120 is configured to provide the respective constituent reference signals 181, 182, 183 to each of the constituent TDC:s 101, 102, 103. Each respective constituent reference signal 181, 182, 183 comprises a delayed version of the reference signal 109.

Generally, the reference signal provider 120 may be configured to provide the delayed version of the reference signal with an equal delay for each respective constituent reference signal 181, 182, 183, with different delays for each respective constituent reference signal 181, 182, 183, or with equal delay for two or more of the respective constituent reference signals 181, 182, 183 and different delay for two or more of the respective constituent reference signals 181, 182, 183.

When the reference signal provider 120 is configured to provide the delayed version of the reference signal with an equal delay for each respective constituent reference signal 181, 182, 183, the delay may be an arbitrary delay or a delay corresponding to a number of clock signal delay components. Example clock signal delay components include the switching circuitries 191, 192, 193, as well as optional switching circuitry 156 which is described later herein.

In some approaches for implementing the delayed version of the reference signal, the reference signal provider 120 comprises a reference signal delayer (RSD; e.g., reference signal delay circuitry or a reference signal delay module) 152, 152'. The RSD may comprise one or more reference signal delay components 153, 154, 161, 162, 163, 164, 165. Each reference signal delay component may have an arbitrary delay or a delay that corresponds to one of the clock signal delay components 191, 192, 193, 156. The latter may be implemented by duplicating the clock signal delay component(s) 191, 192, 193, 156 to implement the reference signal delay component(s) 153, 154, 161, 162, 163, 164, 165. Generally, the reference signal delay components 153, 154, 161, 162, 163, 164, 165 may provide equal, or different, delays.

In the example reference signal delayer 152, all of the one or more reference signal delay components 153, 154 are connected in series for providing the same delayed version of the reference signal for all of the respective constituent reference signals 181, 182, 183.

Alternatively, the reference signal provider provides different delayed versions of the reference signal for two, more, or all of the respective constituent reference signals 181, 182, 183. For example, the reference signal provider may be configured to provide the delayed version of the reference signal by successively increasing the delay for each respective constituent reference signal. For example, the delay may be successively increased by applying an equally sized increase for each respective constituent reference signal 181, 182, 183 along the chain of constituent TDC:s. Alternatively or additionally, the delay may be successively increased by applying an increase for each respective constituent reference signal 181, 182, 183 along the chain of constituent TDC:s. For example, the increase for each respective constituent reference signal 181, 182, 183 may correspond to the clock signal delay component(s) between a corresponding pair of consecutive constituent TDC:s in the chain of constituent TDC:s.

One way to implement these approaches is illustrated by the example reference signal delayer (RSD) 152', which may substitute the example reference signal delayer 152 in some embodiments. Thus, the reference signal provider 152' is configured to provide the delayed version of the reference signal by successively increasing the delay for each respective constituent reference signal. The example reference signal delayer 152' comprises a plurality of reference signal delay components 161, 162, 163, 164, 165 connected in series.

The provision of the delayed version of the reference signal with successively increasing the delay for each respective constituent reference signal 181, 182, 183 is accomplished by using the output of different reference signal delay components 161, 162, 163, 164, 165 for different constituent reference signals 181, 182, 183. Thus, for each respective constituent reference signal 181, 182, 183, a respective subset of the plurality of reference signal delay components 161, 162, 163, 164, 165 is configured to provide the delayed version of the reference signal (the subset 161, 162 for constituent reference signal 181, the subset 161, 162, 163 for constituent reference signal 182, and the subset 161, 162, 163, 164, 165 for constituent reference signal 183).

When the delay of each of the reference signal delay components 163, 164, 165 corresponds to the delay of the clock signal delay component(s) between a corresponding pair of consecutive constituent TDC:s in the chain of constituent TDC:s—i.e., 163 corresponds to 192, and so on—the total delay of each respective constituent reference signal 181, 182, 183 corresponds to the clock signal delay component(s) included up to the relevant point of the chain of constituent TDC:s, possibly with a bias which is the same for all of the respective constituent reference signals 181, 182, 183.

When the delays of the reference signal delay components 163, 164, 165 correspond to the delays of the clock signal delay components as explained above, the determination of the frequency relationship is not adversely affected by the delays of the clock signal delay components 192, 193 (the system will be transparent to the delays of the clock signal delay components 192, 193). Correspondence between delays of the reference signal delay components and delays of the clock signal delay components may be achieved, for example, if all clock signal delay components and reference signal delay components have the same delay, or if reference signal delay components have their delays matched to corresponding clock signal delay components (e.g., 163 matched to 192, and so on).

The determination circuitry 150 is configured to determine a number of consecutively same-valued symbols (e.g., bits) in a concatenation of the digitally represented constituent output signals 131, 132, 133 of the constituent TDC:s 101, 102, 103.

The determination of the number of consecutively same-valued symbols is performed during the first stage as well as during the second stage. In the first stage, the number of consecutively same-valued symbols represent (e.g., is an indication of) the length of a period of the reference signal which translates to reference signal frequency. In the second stage, the number of consecutively same-valued symbols represent (e.g., is an indication of) the length of a period of the clock signal which translates to clock signal frequency.

Generally, the number of consecutively same-valued symbols of one value (e.g., "1") may correspond to the pulse width of the signal input as the constituent clock signal 171 while the number of consecutively same-valued symbols of another value (e.g., "0") may correspond to a duration between the end of one pulse and the start of the next pulse (i.e., each zero-crossing of the constituent clock signal 171 corresponds to a value change for the symbols in the concatenation of the digitally represented constituent output signals 131, 132, 133). When the duty-cycle (the pulse width compared to the period) is 50%, the number of consecutively same-valued symbols of either value (e.g., "0" or "1") may correspond to the length of a half-period of the signal input as the constituent clock signal 171.

Also generally, determining a number of consecutively same-valued symbols may comprise determining the number of symbols between a rising edge and a falling edge (or vice versa) in the digitally represented constituent output signals 131, 132, 133.

Alternatively or additionally, and generally, determining a number of consecutively same-valued symbols may comprise determining the total number of symbols in two neighboring sequences of consecutively same-valued symbols. For example, determining a number of consecutively same-valued symbols may comprise determining the number of symbols between two subsequent rising edges (or between two subsequent falling edges) in the digitally represented constituent output signals 131, 132, 133.

Generally, the total number of symbols in two neighboring sequences of consecutively same-valued symbols may correspond to the length of a period of the signal input as the constituent clock signal 171.

Also generally, a rising edge in the digitally represented constituent output signals may be interpreted as a shift from a first symbol value (e.g., one, "1") to a second symbol value (e.g., zero, "0") in the sequence of symbols of a concatenation of the digitally represented constituent output signals, and a falling edge in the digitally represented constituent output signals may be interpreted as a shift from the second symbol value to the first symbol value in the sequence of symbols of a concatenation of the digitally represented constituent output signals.

For example, the number of consecutively same-valued symbols may be determined as an average number of consecutively same-valued symbols in the concatenation of the digitally represented constituent output signals. Thus, when there are two or more sequences of consecutively same-valued symbols in the concatenation of the digitally represented constituent output signals, an average of the number of symbols in each sequence may represent the number of consecutively same-valued symbols. Other approaches are also possible (e.g., picking one of the sequences—such as the first sequence, the last sequence, or a randomly selected sequence—and letting the number of symbols in the picked sequence represent the number of consecutively same-valued symbols).

In some embodiments, the number of consecutively same-valued symbols is exclusive of initial and/or terminal consecutively same-valued symbols in the concatenation of the digitally represented constituent output signals. Thus, one or both of the first and last sequences of consecutively same-valued symbols in the concatenation of the digitally represented constituent output signals may be excluded when the number of consecutively same-valued symbols is determined. This is because the first and last sequences of consecutively same-valued symbols may not represent a full duration between zero-crossings of the signal input as the constituent clock signal 171.

The determination circuitry 150 is also configured to determine the frequency relationship (e.g., a ratio) between the reference signal 109 and the clock signal 110 based on the number of consecutively same-valued symbols determined during the first stage and the number of consecutively same-valued symbols determined during the second stage. An indication of the frequency relationship may be output at 199.

For example, the determination circuitry may be configured to determine the frequency relationship as a multiplicity between the number of consecutively same-valued symbols determined during the first stage and the number of consecutively same-valued symbols determined during the second stage (e.g., by dividing the former by the latter, or vice versa).

The delay of the reference signal 109 implemented by the reference signal provider 120 for provision of the respective constituent reference signals 181, 182, 183 results in that, when the reference signal 109 is output by the switch 191, a first value change for the symbols in the concatenation of the digitally represented constituent output signals occurs after an initial sequence of consecutively same-valued symbols that corresponds to the delay of the reference signal 109 implemented by the reference signal provider 120.

This has the advantage that the first zero-crossing of the reference signal is more easily captured during the first stage than if no delay of the reference signal was applied.

The determination circuitry 150 may be further configured to determine the delay of the reference signal 109 resulting from the implementation of the reference signal provider 120 (and thereby determine the delay of the reference signal delay components 153, 154) based on a number of initial consecutively same-valued symbols in the concatenation of the digitally represented constituent output signals (the initial sequence of consecutively same-valued symbols) during the first stage.

This determination may be used in the determination of the frequency relationship. Thus, the determination circuitry 150 may be configured to determine the frequency relationship further based on the determined delay of a reference signal delay component.

For example, when all clock signal delay components 191, 192, 193 and reference signal delay components 153, 154 have the same delay, the delay of a reference signal delay component 153, 154 (expressed in number of consecutively same-valued symbols) can be determined by dividing the number of initial consecutively same-valued symbols by the number of reference signal delay components 153, 154 minus the number of clock signal delay components 156, 191 prior to the first constituent TDC (i.e., dividing the number of initial consecutively same-valued symbols by the difference between the number of reference signal delay components and the number of clock signal delay components prior to the first constituent TDC), and the result inherently corresponds to the delay of a clock signal delay component 191, 192, 193 (expressed in number of consecutively same-valued symbols) during the first stage.

Generally, the switching circuitry 156 may or may not be seen as a clock signal delay component, as suitable.

Knowing the delay of a clock signal delay component 191, 192, 193 as well as the number of clock signal delay components, the indication of the length of a period of the signal under consideration (reference signal during the first stage and clock signal during the second stage) may be compensated before it is used to determine the frequency relationship, wherein the compensation comprises removing (or at least mitigating) the impact of the clock signal delay components.

To exemplify the compensation, a scenario with four constituent TDC:s with four delay elements each will be considered, where a delay between constituent TDC:s corresponds to that of two delay elements. Without compensation the bit weight of the concatenated output will be "1 1 1 1 1 1 1 1 1 1 1 1 1 1 1" in this example.

Adding the impact of the delay between constituent TDC:s, this may change to "1 1 1 1 3 1 1 1 3 1 1 1 3 1 1 1" after compensation (or to "1 1 1 2 2 1 1 1 2 2 1 1 2 2 1 1" for minimizing the peak quantization error). When the representation comprises values other than "1", accumulating the values of such a sequence (rather than just counting the number of symbols) would provide values for determining the frequency relationship.

In some embodiments, the determination circuitry 150 is not configured to determine the delay of the reference signal 109 resulting from the implementation of the reference signal provider 120.

In some embodiments, the impact of the clock signal delay components is not mitigated. If this impact is relatively small (e.g., if a ratio of the delay of the clock signal delay components to the delay of the constituent TDC:s falls below a threshold value), the accuracy of the frequency relationship may still be acceptable as will be exemplified later herein.

In some embodiments, the impact of the clock signal delay components is inherently mitigated by matching the clock signal delay components 192, . . . , 193 with corresponding reference signal delay components 163, 164, . . . , 165 when providing the constituent reference signals 181, 182, 183 with successively increasing delays, as exemplified by reference signal delayer 152'.

To further exemplify, assuming that a concatenation of the digitally represented constituent output signals captured during the first stage consists of an initial sequence of a ones, and that the average number of bits between consecutive rising edges in the concatenation of the digitally represented constituent output signals captured during the first stage is b, the reference signal period can be determined to correspond to b cell delays and/or the delay of the reference signal implemented by the reference signal provider can be determined to correspond to a cell delays. Further, assuming that the average number of bits between consecutive rising edges in the concatenation of the digitally represented constituent output signals captured during the second stage is c, the feedback signal period can be determined to correspond to c cell delays.

In some embodiments, the first stage is divided into first and second parts, and the frequency determination device 100 is configured to provide the reference signal 109 as the constituent clock signal 171 to the first constituent TDC 101 during a first part of the first stage, and to provide an inverted version of the reference signal 109 as the constituent clock signal 171 to the first constituent TDC 101 during a second part of the first stage. Generally, the first part of the first stage may precede the second part of the first stage, or vice versa.

This may be accomplished, for example, by an arrangement comprising switching circuitry 156 (e.g., a switch, implemented with a multiplexer, MUX). In one variant, the inverted version of the reference signal 109 is provided by an inverter (e.g., inverting circuitry or an inversion module) 155. In another variant, the reference signal 109 is differential, and the switching circuitry 156 selects one polarity for non-inversion and the other polarity for inversion.

An alternative to the arrangement of using the switching circuitry 156 (and the inverter 155) is to use circuitry implementing an XOR function, wherein the reference signal 109 is provided as one XOR-input and the other XOR-input is a signal controlling whether or not the XOR-output is a non-inverted, or inverted, version of the reference signal.

The arrangement comprising the switching circuitry 156 (or the XOR-implementing circuitry) may be arranged at a reference signal input of the switching circuitry 191, as illustrated in FIG. 1.

These embodiments are particularly suitable when the reference signal has a relatively long period (e.g., a period which is larger than the delay implemented by the chain of constituent TDCs—i.e., a period which is not fully representable by the digitally represented constituent output signal 131, 132, 133—or a period which is larger than a suitable part of the delay implemented by the chain of constituent TDCs), and make it possible to determine a full period from two half-period measurements. The number of delays from the falling to rising edge may be measured during the first part of the first stage, and the number of delays from the rising to falling edge may be measured during the second part of the first stage. Then the full period may then be calculated as the sum of the two number of delays.

Alternatively or additionally, frequency multipliers can be used to reduce the TDC range required to measure the reference frequency period.

FIG. 2 schematically illustrates an example constituent TDC (cTDC) 200 according to some embodiments. The example cTDC 200 of FIG. 2 may be used as one or more of the constituent TDC:s 101, 102, 103 of FIG. 1 and/or as one or more of the constituent TDC:s 301, 302, 303, 304, 308 of FIG. 3 (which will be described later herein).

The constituent TDC 200 is configured to provide a digitally represented constituent output signal 232 in response to receiving a constituent reference signal 282 and a constituent clock signal 210.

The constituent TDC 200 comprises a plurality of delay elements (D; e.g., implemented using inverters) 201, 202, 203 arranged in sequence to successively delay a constituent clock signal 210 (compare with 110 of FIGS. 1 and 371, 372, 373, 374, 378 of FIG. 3).

The constituent TDC 200 also comprises a corresponding plurality of output ports, wherein each output port is configured to—when triggered by a constituent reference signal 282 (compare with 181, 182, 183 or FIGS. 1 and 381, 382, 383, 394, 388 of FIG. 3)—provide an output of one of the delay elements 201, 202, 203 as a symbol (e.g., a bit) 232a, 232b, 232c of the digitally represented constituent output signal 232 (compare with 131, 132, 133 of FIGS. 1 and 331, 332, 333, 334, 338 of FIG. 3).

In the example constituent TDC 200, each output port is implemented using a (digital) flip-flop circuit (FF) 211, 212, 213 having an output of a respective delay element 201, 202, 203 as input and being triggered (clocked) by the constituent reference signal 282 to output the respective symbol 232a, 232b, 232c.

Thus, in some embodiments, the constituent clock signal (CKV; e.g., a variable clock) is fed to the delay line comprising the plurality of delay elements, and the delay line state is sampled (e.g., by digital flip-flops) at an edge of the constituent reference signal (REF). The time difference between CKV and REF is thereby converted into the sampled state as quantized by the delay elements.

In some embodiments, the example constituent TDC 200 is also configured to provide a delayed version 242 of the constituent clock signal 210. This may, for example, be achieved by using the output of the last delay element 203 (either directly as illustrated in FIG. 2, or by using a buffer).

Generally, all of the plurality of constituent TDC:s of a frequency determination device (e.g., 101, 102, 103 of FIGS. 1 and/or 301, 302, 303, 304, 308 of FIG. 3) may be identical. Alternatively or additionally, one or more of the constituent TDC:s of a frequency determination device may differ in one or more aspects from other constituent TDC:s of a TDC circuitry. Differences between constituent TDC:s may, for example, be different length (e.g., different number of delay elements 201, 202, 203 and corresponding output ports) and/or different delay duration for each of the delay elements 201, 202, 203.

FIG. 3 schematically illustrates an example frequency determination device 300 according to some embodiments. As will be explained in the following, the example frequency determination device 300 may additionally be configurable (e.g., configured) to operate as TDC circuitry. Therefore, the example frequency determination device 300 may be alternatingly referred to as an example TDC circuitry 300. Some functional blocks which are optional for frequency determination according to some embodiments are illustrated using dashed lines in FIG. 3.

The TDC circuitry of some embodiments may be used in any applications where a TDC is suitable. For example, the TDC circuitry disclosed herein may be used for one or more of: an analog-to-digital converter (ADC), a phase locked loop (PLL), a communication transmitter, a communication receiver, a communication device, a range finder, a RADAR equipment, a LIDAR equipment, and an equipment for determining collision times in a particle collider. The TDC circuitry of some embodiments may be particularly beneficial when a high resolution, without unnecessary increase of power consumption and/or chip area and/or complexity, is desired.

The example TDC circuitry 300 is for converting a phase difference between an input reference signal represented by 309 and an input clock signal represented by 310 to a digitally represented output signal 339.

The TDC circuitry 300 comprises a reference signal provider (RSP) 320, and a plurality of constituent TDC:s (cTDC) 301, 302, 303, 304, 308. For frequency determination operation, the TDC circuitry also comprises determination circuitry (DET; e.g., a determiner or a determination module) 350. For TDC operation, the TDC circuitry also comprises a digital signal combiner (COMB) 330; illustrated as optional in FIG. 3.

The example TDC circuitry 300 represents a TDC circuitry configured for switching between a parallel operation mode and at least one of a serial operation mode and one or more intermediate operation modes.

Switching between the different operation modes may be accomplished by a mode selection signal input 390, for example. In some embodiments, the mode selection signal input may be configured to receive any of two alternative inputs (e.g., in the form of a bit having a value of either zero or one); e.g., when the example TDC circuitry 300 is configured for switching between two operation modes. In some embodiments, the mode selection signal input may be configured to receive any of a more than two (e.g., three, four, etc.) alternative inputs; e.g., when the example TDC circuitry 300 is configured for switching between more than two operation modes. For example, when the example TDC circuitry 300 is configured for switching between three operation modes, the mode selection signal input may be configured to receive any of three alternative inputs (e.g., in the form of two bits having a value of either 00, 01, or 10-11 being unused), and when the example TDC circuitry 300 is configured for switching between four operation modes, the mode selection signal input may be configured to receive any of four alternative inputs (e.g., in the form of two bits having a value of either 00, 01, 10, or 11), etc.

In the parallel operation mode, the plurality of constituent TDC:s 301, 302, 303, 304, 308 operate in a parallel processing fashion. In this operation mode, a maximum TDC resolution may be achieved.

In the serial operation mode, the plurality of constituent TDC:s 301, 302, 303, 304, 308 operate in a serial processing fashion, wherein all of the constituent TDC:s are successively connected to each other such that a delayed version (compare with 242 of FIG. 2) of the constituent clock signal (compare with 210 of FIG. 2) of a first constituent TDC is used as the constituent clock signal for a second constituent TDC, a delayed version of the constituent clock signal of the second constituent TDC is used as the constituent clock signal for a third constituent TDC, and so on. In this operation mode, a maximum TDC range may be achieved (which may be useful, e.g., for a frequency acquisition procedure of a phase locked loop, PLL).

In an intermediate operation mode, the plurality of constituent TDC:s 301, 302, 303, 304, 308 are grouped into a plurality of (non-overlapping) collections of constituent TDC:s. Within each collection, the constituent TDC:s operate in a serial processing fashion as described above, while the plurality of collections of constituent TDC:s operate in a parallel processing fashion. In this operation mode, a medium TDC resolution and a medium TDC range may be achieved.

In the following, embodiments will be described with one intermediate operation mode. However, this is not intended as limiting. Contrarily, no, two, or more intermediate operation modes may be applicable according to some embodiments. Different intermediate operation modes may apply different grouping. For example, one intermediate operation mode may have two collections of constituent TDC:s, and other intermediate operation modes may have more than two (e.g., three, four, . . . , eight, . . . , etc.) collections of constituent TDC:s.

The reference signal provider 320 is configured to provide respective constituent reference signals 381, 382, 383, 384, 388 to each of the constituent TDC:s 301, 302, 303, 304, 308. Each of the respective constituent reference signals 381, 382, 383, 384, 388 is based on the input reference signal 309.

Each constituent TDC is configured to convert a phase difference between the constituent reference signal 381, 382, 383, 384, 388 and a constituent clock signal 371, 372, 373, 374, 378 to a digitally represented constituent output signal 331, 332, 333, 334, 338.

In TDC operation, the constituent clock signal 371, 372, 373, 374, 378 for each of the constituent TDC:s is either the input clock signal 310 used directly or a respectively delayed version 342, 343, 344, 348 (compare with 242 of FIG. 2) of the constituent clock signal 372, 373, 374, 378 from another constituent TDC. Selection of the constituent clock signal 371, 372, 373, 374, 378 for a constituent TDC, between the input clock signal 310 and a delayed version thereof 342, 343, 344, 348 is implemented using respective switching circuitry 391, 392, 393, 394.

The digital signal combiner 330 is configured to provide the digitally represented output signal 339 based on the digitally represented constituent output signals 331, 332, 333, 334, 338 of the constituent TDC:s.

In the parallel operation mode, each respective constituent reference signal 381, 382, 383, 384, 388 comprises a respectively delayed version of the input reference signal 309, with different respective delays for at least two of the respective constituent reference signals. The delay of the input reference signal 309 may be achieved by the reference signal provider 320 having delay elements 321, 322, 323, 324, 328 providing a respective delay for each of the constituent TDC:s 301, 302, 303, 304, 308.

The delay elements 321, 322, 323, 324, 328 may be variably controllable as illustrated in FIG. 3. The control may be exercised by a controller (e.g., controlling circuitry or a control module) 325 comprised in, or otherwise associated with (e.g., connectable, or connected, to) the reference signal provider 320. For example, the provision of the respective delays may be implemented by a random number generator (RNG) 329.

As mentioned above, the respective delays may be stochastically generated and/or randomly distributed, and/or distributed within a range associated with a constituent TDC resolution, and/or uniformly or non-uniformly distributed within a distribution range.

In the parallel operation mode, the constituent clock signal 371, 372, 373, 374, 378 for each of the constituent TDC:s is the input clock signal 310 used directly. Thus, the mode selection signal input 390 may cause all of the respective switching circuitries 391, 392, 393, 394, 398 to convey the input clock signal 310 (upper switch position according to FIG. 3).

In the parallel operation mode, the digital signal combiner 330 is configured to provide the digitally represented output signal 339 based directly on the digitally represented constituent output signals 331, 332, 333, 334, 338 of each of the constituent TDC:s. For example, the digitally represented output signal 339 may be provided as a digital addition of two or more (typically all) of the digitally represented constituent output signals 331, 332, 333, 334, 338, as an average value of two or more (typically all) of the digitally represented constituent output signals 331, 332, 333, 334, 338, or as a median value of two, three, or more (typically all) of the digitally represented constituent output signals 331, 332, 333, 334, 338.

In this operation mode, the cTDC:s 301, 302, 303, 304, 308 operate in parallel, and interleaving is used to provide high resolution.

In the serial operation mode, each respective constituent reference signal 381, 382, 383, 384, 388 may comprise a respectively delayed version of the input reference signal 309, with different respective delays for at least two of the respective constituent reference signals, as in the parallel operation mode. Alternatively, the same constituent reference signal 381, 382, 383, 384, 388 (e.g., the input reference signal 309, or an equally delayed version thereof) may be provided to all of the constituent TDC:s.

In the serial operation mode, the input clock signal 310 is provided directly as respective constituent clock signal 378 to one constituent TDC 308, and respectively delayed versions 348, 344, 343, 342 of the input clock signal are successively provided as respective constituent clock signals 374, 373, 372, 371 to the other constituent TDC:s 304, 303, 302, 301. Thus, the mode selection signal input 390 may cause the respective switching circuitry 398 to convey the input clock signal 310 (upper switch position according to FIG. 3), and all of the other respective switching circuitries 391, 392, 393, 394 to convey the respectively delayed versions 348, 344, 343, 342 of the input clock signal (lower switch position according to FIG. 3).

In the serial operation mode, the digital signal combiner 330 is configured to provide the digitally represented output signal 339 as a concatenation of the digitally represented constituent output signals 331, 332, 333, 334, 338 of the constituent TDC:s.

In this operation mode, there is no cTDC parallelization (and no interleaving will take place to provide high resolution). Instead, high range is achieved due to the long chain of cTDC:s.

In the intermediate operation mode, each respective constituent reference signal 381, 382, 383, 384, 388 may comprise a respectively delayed version of the input reference signal 309, with different respective delays for at least two of the respective constituent reference signals, as in the parallel operation mode.

For example, at least two of the respective constituent reference signals within a (e.g., each) collection of constituent TDC:s may have different respective delays, as in the parallel operation mode. Alternatively, the same constituent reference signal (e.g., the input reference signal 309, or an equally delayed version thereof) may be provided to all of the constituent TDC:s within a (e.g., each) collection of constituent TDC:s, wherein the constituent reference signal may, or may not, differ between collections.

In the intermediate operation mode, the input clock signal 310 is provided directly as respective constituent clock signal to one (first) constituent TDC of each collection, and respectively delayed versions of the input clock signal are successively provided within each collection as respective constituent clock signals to the other constituent TDC:s. Thus, the mode selection signal input 390 may cause the respective switching circuitries of one (first) constituent TDC of each collection to convey the input clock signal 310 (upper switch position according to FIG. 3), and all of the other respective switching circuitries to convey the respectively delayed versions of the input clock signal (lower switch position according to FIG. 3).

In the intermediate operation mode, the digital signal combiner 330 is configured to provide the digitally represented output signal 339 based on concatenations of the digitally represented constituent output signals 331, 332, 333, 334, 338, wherein each concatenation is for a corresponding collection of constituent TDC:s.

The mode selection signal input 390 may be configured to receive a control signal specifying the operation mode (parallel operation mode or other operation mode, wherein the other operation mode is one or more of serial operation mode and one or more intermediate operation mode). Thus, the control signal may have two allowed values (e.g., parallel/serial or parallel/intermediate), three allowed values (e.g., parallel/intermediate/serial or parallel/first intermediate/second intermediate), or more than three allowed values (e.g., parallel/two or more intermediate/serial or parallel/three or more intermediate).

Based on the operation mode indicated by the control signal, the mode selection signal input 390 may cause the reference signal provider 320 to provide the constituent reference signal according to the above description, and/or cause the switching circuitries 391, 392, 393, 394, 398 to provide the respective constituent clock signal according to the above description, and/or cause the digital signal combiner 330 to provide the digitally represented output signal according to the above description and/or cause configuration for TDC functionality or frequency determination functionality.

Generally, the digitally represented signal value (e.g., 331, 332, 333, 334, 338) may represent the positions of change in signal polarity. This may be particularly applicable for the longer delay lines (e.g., serial and possibly some intermediate operational modes), where multiple transitions can occur within the same delay line. Generally, multiple transitions can occur within the output of a single constituent TDC and/or within a concatenation of outputs from two or more constituent TDC:s. This can be exploited for frequency determination as will be elaborated on in the following.

When the TDC circuitry 300 is in the serial operation mode, it can function as a frequency determination device 300. The same may be true in some intermediate operational modes (especially when a collection of constituent TDC:s comprises a relatively large amount of constituent TDC:s and/or provides a relatively long overall delay), but the description herein will use the serial operation mode as an illustrative example.

When configured to function as a frequency determination device 300 in the serial operation mode, each respective constituent reference signal 381, 382, 383, 384, 388 (compare with 181, 182, 183 of FIG. 1) may comprise a respectively delayed version of the input reference signal 309 (compare with 109 of FIG. 1). The respectively delayed versions of the input reference signal 309 may be equally delayed versions of the reference signal (compare with 152 of FIG. 1) or successively delayed versions of the reference signal (compare with 152' of FIG. 1).

When configured to function as a frequency determination device 300 in the serial operation mode, a first stage comprises provision of the input reference signal 309 as the respective constituent clock signal 378 of one (first) constituent TDC 308 (compare with 171 and 101 of FIG. 1) and a second stage comprises provision of the input clock signal 310 as the respective constituent clock signal 378 of the one (first) constituent TDC 308, as explained in connection with FIG. 1. Respectively delayed versions 348, 344, 343, 342 of the constituent clock signal 378 are successively provided as respective constituent clock signals 374, 373, 372, 371 to the other constituent TDC:s 304, 303, 302, 301 (compare with 172, 173 and 102, 103 of FIG. 1). Thus, the mode selection signal input 390 may cause the respective switching circuitry 398 to convey the input reference signal 309 (lower switch position according to FIG. 3) during the first stage and the input clock signal 310 (upper switch position according to FIG. 3) during the second stage, and all of the other respective switching circuitries 391, 392, 393, 394 to convey the respectively delayed versions 348, 344, 343, 342 of the constituent clock signal 378 (lower switch position according to FIG. 3).

Thus, FIG. 3 schematically illustrates an example frequency determination device 300 implemented using a TDC circuitry architecture, and suitable for determining (e.g., configured to determine) a frequency relationship between a reference signal 309 and a clock signal 310. The frequency relationship may be indicated by an output signal 399.

The frequency determination device 300 may, for example, be comprised in one or more of: a phase locked loop (PLL), a frequency-locked loop (FLL), an analog-to-digital converter (ADC), and a communication device (e.g., a wireless communication device, such as a radio access node or a user equipment, UE).

When the frequency determination device 300 is for a frequency-locked loop, the reference signal 309 may be an input signal of the frequency-locked loop and the clock signal 310 may be a feedback signal of the frequency-locked loop.

Alternatively or additionally, when the frequency determination device 300 is for a frequency-locked loop, the frequency relationship indicated by the output signal 399 may be used to control an oscillator (e.g., a voltage controller oscillator) of the FLL to enable frequency locking.

For example, an FLL may be formed according to any suitable approach, wherein the frequency relationship (e.g., a frequency ratio) is compared to a target value and the difference is fed to a controller (e.g., a loop filter) that adjusts a control signal for a digitally controlled oscillator.

The frequency determination device 300 comprises a plurality of constituent time-to-digital converters 301, 302, 303, 304, 308, a reference signal provider (RSP; e.g., reference signal providing circuitry or a reference signal provision module) 320, switching circuitry represented by a switch (e.g., implemented with a multiplexer, MUX) 398, and determination circuitry (DET; e.g., a determiner or a determination module) 350.

The plurality of constituent TDC:s 301, 302, 303, 304, 308 may be delay-line based TDC:s, which has been exemplified further in connection with FIG. 2.

Each constituent TDC 301, 302, 303, 304, 308 is configured to provide a digitally represented constituent output signal 331, 332, 333, 334, 338 in response to receiving a constituent reference signal 381, 382, 383, 384, 388 and a constituent clock signal 371, 372, 373, 374, 378.

As illustrated in FIG. 3 and already mentioned above, the switch 398 is configured to provide the constituent clock signal 378 to the first constituent TDC 308. The switch 398 is configured to provide either of the reference signal 309 and the clock signal 310 as the constituent clock signal 378 of the first constituent TDC 308. Typically, the switch is configured to provide the reference signal 309 as the constituent clock signal 378 to the first constituent TDC 308 during a first stage, and to provide the clock signal 310 as the constituent clock signal 378 to the first constituent TDC 308 during a second stage.

As also mentioned before, the frequency determination device 300 is configured to (by operating the TDC circuitry in a serial operation mode) successively provide respectively delayed versions of the constituent clock signal 378 of the first constituent TDC 308 as respective constituent clock signals 374, 373, 372, 371 to the other constituent TDC:s 304, 303, 302, 301. The delay of the respectively delayed versions of the constituent clock signal 378 may be successively provided by the constituent TDC:s, and possibly by further delay elements (clock signal delay components; e.g., switching circuitries, for example implemented with respective multiplexers) 394, 393, 392, 391 in the chain of constituent TDC:s.

The reference signal provider 320 is configured to provide the respective constituent reference signals 381, 382, 383, 384, 388 to each of the constituent TDC:s 301, 302, 303, 304, 308. Each respective constituent reference signal 381, 382, 383, 384, 388 comprises a delayed version of the reference signal 309.

Generally, the reference signal provider 320 may be configured to provide the delayed version of the reference signal with an equal delay for each respective constituent reference signal 381, 382, 383, 384, 388, with different delays for each respective constituent reference signal 381, 382, 383, 384, 388, or with equal delay for two or more of the respective constituent reference signals 381, 382, 383, 384, 388 and different delay for two or more of the respective constituent reference signals 381, 382, 383, 384, 388.

When the reference signal provider 320 is configured to provide the delayed version of the reference signal with an equal delay for each respective constituent reference signal 381, 382, 383, 384, 388, the delay may be an arbitrary delay or a delay corresponding to a number of clock signal delay components. Example clock signal delay components include the switching circuitries 391, 392, 393, 394, 398, as well as optional switching circuitry 356 which is described later herein.

In some approaches for implementing the delayed version of the reference signal, the reference signal provider 320 comprises a reference signal delayer (RSD; e.g., reference signal delay circuitry or a reference signal delay module) 352. The RSD may, for example, be comprised in, or otherwise associated with, the controller 325. The RSD may comprise one or more reference signal delay components 353, 354. Each reference signal delay component may have an arbitrary delay or a delay that corresponds to one of the clock signal delay components 391, 392, 393, 394, 398, 356. The latter may be implemented by duplicating the clock signal delay component(s) to implement the reference signal delay component(s). Generally, the reference signal delay components 353, 354 may provide equal, or different, delays.

In the example reference signal delayer 352, all of the one or more reference signal delay components 353, 354 are connected in series for providing the same delayed version of the reference signal for all of the respective constituent reference signals 381, 382, 383, 384, 388.

The variable delay elements 321, 322, 323, 324, 328 may be disabled and replaced by the reference signal delayer 352, or the reference signal delayer 352 may be configured to control the variable delay elements 321, 322, 323, 324, 328 to implement the delay of the one or more reference signal delay components 353, 354 connected in series.

Alternatively, the reference signal provider provides different delayed versions of the reference signal for two, more, or all of the respective constituent reference signals 381, 382, 383, 384, 388. For example, the reference signal provider may be configured to provide the delayed version of the reference signal by successively increasing the delay for each respective constituent reference signal as described in connection with FIG. 1 (see, e.g., the example reference signal delayer 152').

The determination circuitry 350 is configured to determine a number of consecutively same-valued symbols (e.g., bits) in a concatenation of the digitally represented constituent output signals 331, 332, 333, 334, 338 of the constituent TDC:s, as has already been elaborated on in connection with FIG. 1.

The determination of the number of consecutively same-valued symbols is performed during the first stage as well as during the second stage. In the first stage, the number of consecutively same-valued symbols represent (e.g., is an indication of) the length of a period of the reference signal which translates to reference signal frequency. In the second stage, the number of consecutively same-valued symbols represent (e.g., is an indication of) the length of a period of the clock signal which translates to clock signal frequency.

The determination circuitry 350 is also configured to determine the frequency relationship (e.g., a ratio) between the reference signal 309 and the clock signal 310 based on the number of consecutively same-valued symbols determined during the first stage and the number of consecutively same-valued symbols determined during the second stage, as has already been elaborated on in connection with FIG. 1. An indication of the frequency relationship may be output at 399.

The determination circuitry 350 may be further configured to determine the delay of the reference signal 309 resulting from the implementation of the reference signal provider 320 (and thereby determine the delay of the reference signal delay components 353, 354) based on a number of initial consecutively same-valued symbols in the concatenation of the digitally represented constituent output signals during the first stage. This determination may be used in the determination of the frequency relationship, as has already been elaborated on in connection with FIG. 1.

In some embodiments, the first stage is divided into first and second parts, and the frequency determination device 300 is configured to provide the reference signal 309 as the constituent clock signal 378 to the first constituent TDC 308 during a first part of the first stage, and to provide an inverted version of the reference signal 309 as the constituent clock signal 378 to the first constituent TDC 308 during a second part of the first stage.

This may be accomplished, for example, by an arrangement comprising switching circuitry 356 (e.g., a switch, implemented with a multiplexer, MUX) and an inverter (e.g., inverting circuitry or an inversion module) 355. An alternative to the arrangement of switching circuitry 356 and inverter 355 is circuitry implementing an XOR function. The arrangement (or XOR-implementing circuitry) may be arranged at a reference signal input of the switching circuitry 398, as illustrated in FIG. 3.

As described in connection with FIG. 1, these embodiments are particularly suitable when the reference signal has a relatively long period, and frequency multipliers can be used (additionally or alternatively) to reduce the TDC range required to measure the reference frequency period.

Various time-to-digital conversion approaches are known in the art. Many time-to-digital converters (TDC:s) experience one or more of the following problems/drawbacks: that the maximum resolution is lower than desired, that the maximum (time) range is lower than desired, that the power consumption is higher than desired, that the implementation complexity and/or size is higher than desired, that the accuracy is lower than desired, that the noise is higher than desired, and that the non-linearity is higher than desired.

When a TDC is used in a (digital) PLL, it is common to introduce additional circuitry (e.g., a dedicated frequency locked loop, a high frequency counter, or a divider) to be able to secure locking. This is particularly relevant when the TDC is limited to cover only one period of the CKV signal, or when the range is otherwise too small to guarantee PLL locking. Furthermore, a mechanism is typically needed to ensure that the PLL is locking to the correct multiple of the REF frequency. The additional circuitry typically increases circuit complexity and/or chip area.

The frequency determination device 100 of FIG. 1 and/or the TDC circuitry/frequency determination device 300 of FIG. 3 may mitigate or alleviate one or more of these or other problems/drawbacks. For example, additional circuitry for frequency locking can be avoided (or at least reduced compared to prior art solutions) by operating the circuitry of FIG. 3 as a frequency-to-digital converter (FDC); enabling a frequency-locked loop to be formed.

As already described above, the delay line is calibrated by feeding the reference signal 309 to both the reference signal input (TDC trigger signal input) REF and the clock signal input CVK of the TDC/FDC (first stage), with a (comparatively short) delay for the TDC trigger signal input to increase the probability that the first reference signal input edge is properly captured in the delay line at the sampling instant. In typical situations, the full waveform (e.g., at least one period) of the reference signal will then be sampled at the delay line outputs, and the period of the reference signal can be determined (expressed in terms of a number of cell delays of the delay line). The calibration stage will typically be very fast; using only a few reference signal cycles.

After the calibration stage (i.e., in a second stage), the reference signal is fed to the TDC trigger signal input (still with the relatively small delay) and the feedback signal of the FLL is fed to the clock signal input of the delay line. When the frequency of the feedback signal—which may come directly from the PLL/FLL output—is relatively high, multiple periods of the feedback signal will be present at the delay line outputs, sampled by the TDC trigger signal REF. The period of the feedback signal can be determined (expressed in terms of a number of cell delays of the delay line) by counting the number of bits of a sampled signal period.

The output of the FDC may be calculated by dividing the reference period achieved during the first stage by the feedback signal period achieved during the second stage to achieve a feedback-to-reference frequency ratio. The frequency ratio can be estimated with high accuracy since the same delay line is used to determine both the reference period and the feedback signal period. This also makes the technique robust against process variations, voltage variations, and temperature variations.

Figure 4:
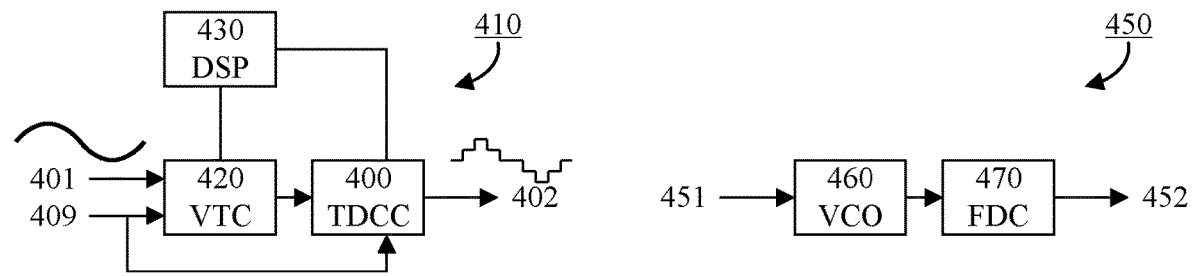
FIG. 4 is a schematic block diagram illustrating an example analog-to-digital converter (ADC) according to some embodiments.

Based on the measured frequency ratio, a system comprising the frequency determiner 100, 300 can be operated as a frequency-locked loop. When, the frequency is close enough to the target value, operation can be switched to a phase-locked loop operation mode, as applicable. FIG. 4 schematically illustrates two example analog-to-digital converters (ADC) 410, 450 according to some embodiments.

The ADC 410 has an input port 401 for the analog signal to be converted and an input port 409 for a reference signal (compare with 309 of FIG. 3). The signal to be converted and the reference signal are input to a voltage-to-time converter (VTC) 420 and the output therefrom is a clock signal delayed with respect to the reference signal (with a delay depending on, e.g., proportional to, the input signal voltage). This signal (which corresponds to the input clock signal 310 of FIG. 3) is input to a time-to-digital converter circuitry (TDCC) 400, which may be any of the TDC circuitries described herein (e.g., the TDC circuitry 300 of FIG. 3). The TDCC measures the time difference between the reference signal and the signal delayed by the VTC. The TDCC thereby provides a digitized version of the signal to be converted (corresponding to the digitally represented output signal 339 of FIG. 3) via an output port 402. A digital signal processor (DSP) 430 controls the VTC 420 and the TDCC 400.

The ADC 450 has an analog input port 451, and the analog input signal is input to a voltage-controlled oscillator (VCO) 460. The analog input signal controls the frequency of the VCO. The output from the VCO is input to a frequency-to-digital converter (FDC) 470, which may be any of the suitable circuitries described herein (e.g., the TDC circuitry 300 of FIG. 3). The FDC detects the frequency of the VCO output signal, and converts it to digital form which is provided via an output port 452.

Figure 5:
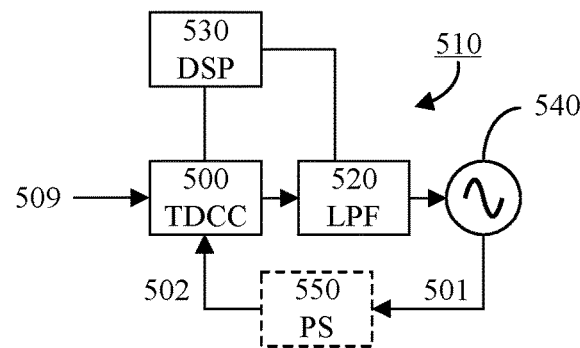
FIG. 5 is a schematic block diagram illustrating an example PLL according to some embodiments.

FIG. 5 schematically illustrates an example phase locked loop (PLL) 510 according to some embodiments. The PLL 510 has an input port 509 for a reference signal (compare with 309 of FIG. 3). The reference signal is input to a time-to-digital converter circuitry (TDCC) 500, which may be any or the TDC circuitries described herein (e.g., TDC circuitry 300 of FIG. 3). The TDCC also receives a feedback signal 502 (which corresponds to the input clock signal 310 of FIG. 3). In response to the phase difference between the input signals, the TDCC provides a digital signal (corresponding to the digitally represented output signal 339 of FIG. 3) via an output port, which signal is passed through a low-pass filter (LPF) 520. The output of the low-pass filer is used to control an oscillator 540 producing a signal 501 for feedback. The signal 501 for feedback may be provided as the feedback signal 502 to the TDCC. Optionally, the signal 501 for feedback is passed through a pre-scaler (PS) 550 before being provided as the feedback signal 502 to the TDCC. Particularly, the pre-scaler 550 may be useful when the frequency of the oscillator is higher than the maximum frequency that the TDCC can handle with high performance. A digital signal processor (DSP) 530 controls the TDCC 500 and the low-pass filter 520.

The PLL 510 may—alternatively or additionally—operate as a frequency-locked loop (FLL), according to some embodiments, wherein the frequency relationship indicated by the output signal (compare with 399 of FIG. 3) from the TDCC 500, is used to control an oscillator 540 to enable frequency locking. Thus, the frequency relationship is fed to a controller (e.g., a loop filter 520) that adjusts a control signal for the digitally controlled oscillator 540.

For FLL functionality the maximum frequency estimation error should typically be below half the reference signal frequency (i.e., the error of the frequency ratio should typically be less than 0.5). If each constituent TDC can sample the constituent clock signal input to the first constituent TDC at, or below, the Nyquist limit defined by the period of the constituent clock signal (i.e., if one period of the constituent clock signal is equal to, or longer than, the delay of two delay-line cells), then it is typically possible for the approaches presented herein to correctly detect the integer part of the multiplication factor (i.e., the integer part of the frequency ratio). When the constituent TDC:s are designed with a time resolution that is considerably higher than the above limit, the fractional part of the multiplication factor can typically also be detected with high accuracy.

Some numerical examples will now be presented for further understanding. In these examples, the reference signal (REF) frequency is 120 MHz and the feedback signal (CKV) frequency is 6 GHz. The TDC resolution is 10 ps and—in the chain of constituent TDC:s—there are a total of 1000 delay cells, which results in a TDC range of 10 ns. This range is enough to cover one reference cycle (i.e., a period of the reference signal). Two possible cases will be considered for this scenario.

In a first case, the CKV period of 166.666 . . . ps is estimated relatively accurate to 166.7 ps using averaging and the estimation error of the REF period dominates. The REF period of 8.3333 . . . ns is quantized by the 10 ps resolution, resulting in 8330 ps or 8340 ps, and the estimated frequency ratio becomes 8330/166.7≈49.97 or 8340/166.7≈50.02 (i.e., very close to the correct value of 50). That the reference period is long compared to the TDC resolution provides excellent accuracy.

In a second case, the CKV period is not accurately estimated, and the difference $\Delta T_{CKV} = T_{CKV} - \hat{T}_{CKV}$ between the actual $T_{CKV}$ and estimated $\hat{T}_{CKV}$ values of the CKV period is amplified by the FLL multiplication ratio N. Therefore, $N \Delta T_{CKV}$ typically needs to be less than half a CKV period in this case, which leads to:

$$-0.5 T_{CKV} < N(T_{CKV} - \hat{T}_{CKV}) < 0.5 T_{CKV}$$

$$-T_{CKV} < 2N(T_{CKV} - \hat{T}_{CKV}) < T_{CKV}$$

$$\frac{2N-1}{2N} < \frac{\hat{T}_{CKV}}{T_{CKV}} < \frac{2N+1}{2N}$$

Thus, considering the example with N=50, the error of the estimated CKV period must be within ±1%. Counting the number of symbols (i.e., the number of delay cells) corresponding to one CKV period would result in 160 ps or 170 ps, i.e., an error of −4.0% or 2.0%. Averaging the number of symbols over approximately 10 CKV periods (or more) should typically bring the absolute error below 1%. This may be accomplished by taking one measurement from each constituent TDC and sufficient accuracy may then be reached in a single measurement (i.e., a single capture).

The higher the value of N is, the more accurately the CKV period needs to be estimated. Averaging over time (i.e., accumulating TDC outputs for a plurality of captures over time) can be used to improve the accuracy for high values of N.

A frequency determination device, such as that of FIG. 3, designed in a 22 nm CMOS FD-SOI (complementary metal oxide semiconductor fully depleted silicon on insulator) technology will now be used to illustrate achievable results.

The frequency determination device comprises 22 constituent TDC:s, each having 20 delay elements with a resolution of around 5.8 ps. An ideal CKV signal with a frequency of 10 GHz and an ideal REF signal of 492 MHz were used. Some example results are shown in FIGS. 6A and 6B.

Figure 6A:
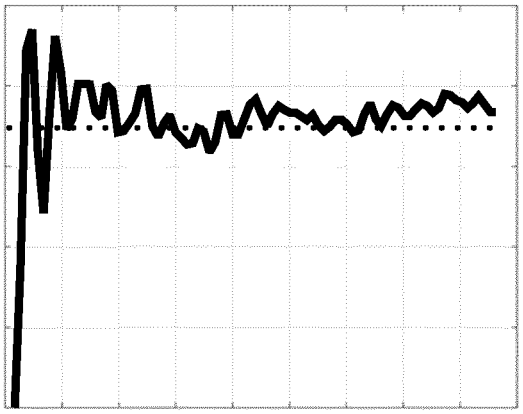
FIG. 6A is a collection of simulation plots illustrating example results achievable by application of some embodiments.
Figure 6A:
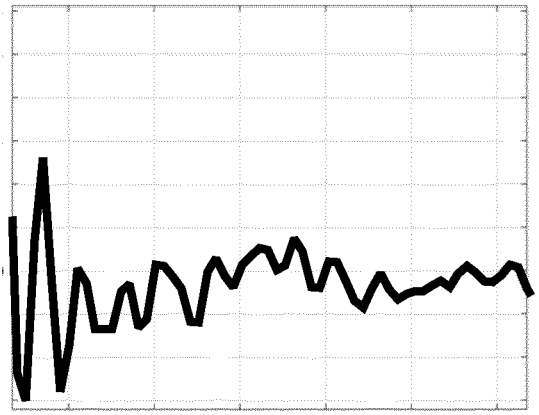
Figure 6A:
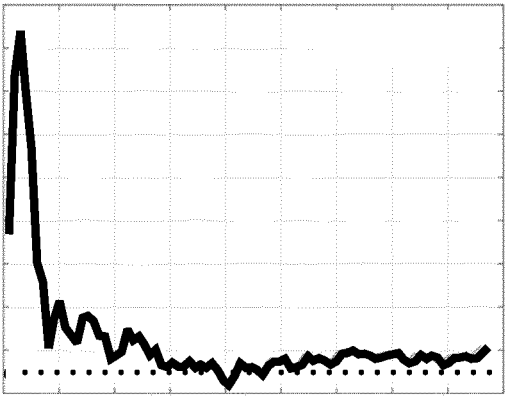
Figure 6A:
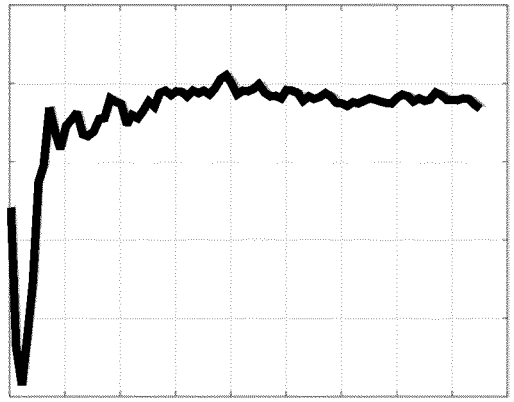
Figure 6A:
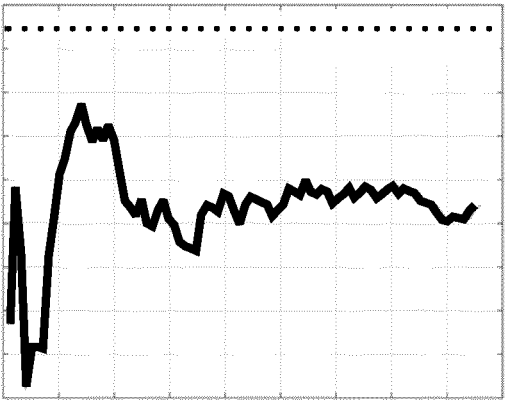
Figure 6A:
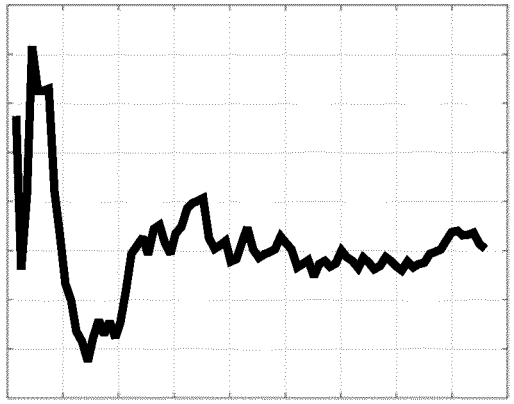
Figure 6B:
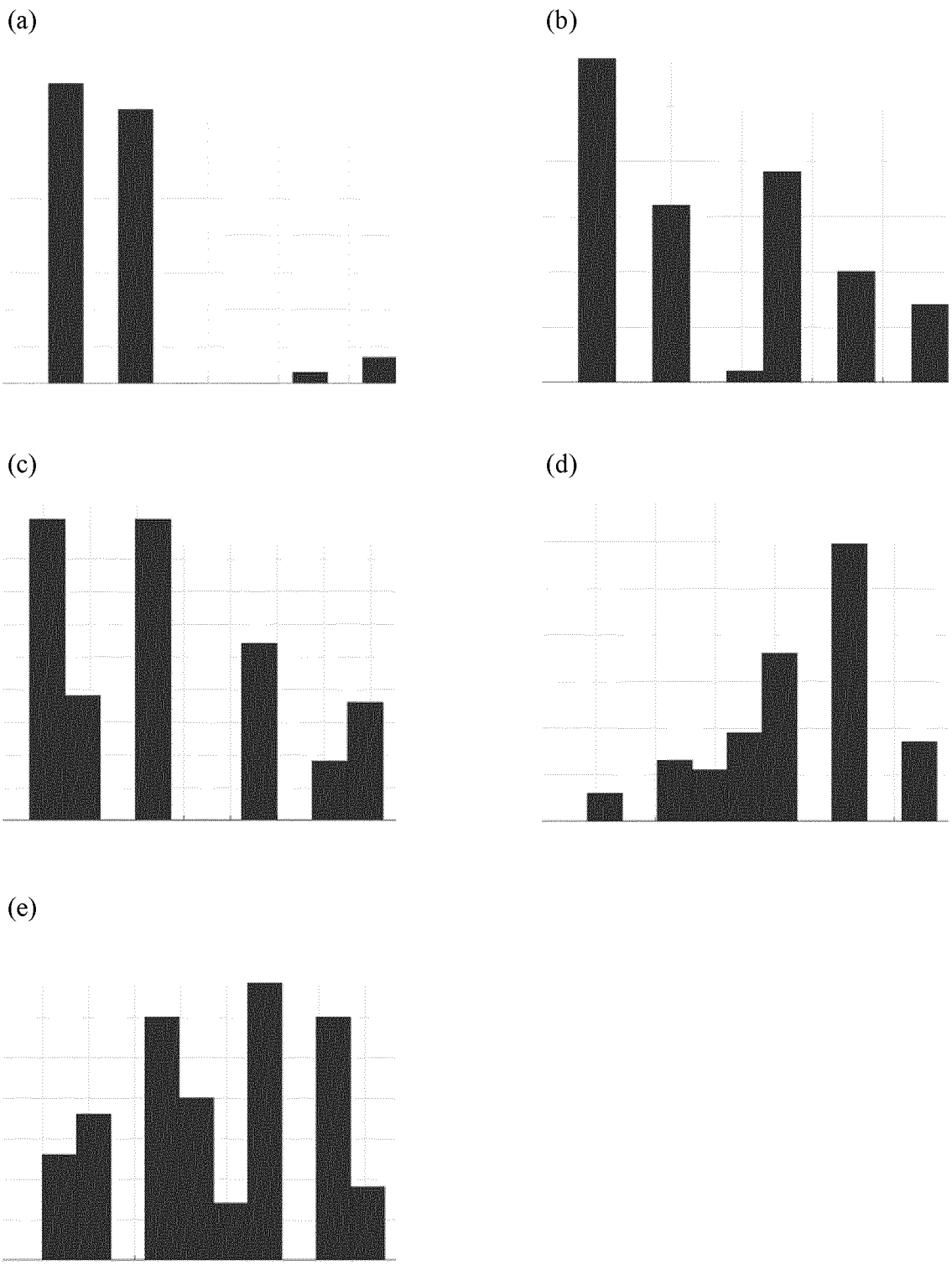
FIG. 6B is a collection of simulation diagrams illustrating example results achievable by application of some embodiments.

For the results of FIG. 6A, intermediate MUX:s (compare with 391, 392, 393, 394, 398) were de-embedded by cascading five MUX:s (compare with 353, 354) at the constituent clock signal input of the first constituent TDC to characterize them in the measurement. An initial sequence of ones in the output signal represents the delay of the MUX:s used for the reference signal, so the delay of one MUX can be calculated using the first rising edge. For the results of FIG. 6B, intermediate MUX:s (compare with 391, 392, 393, 394, 398) were not de-embedded.

In relation to FIG. 6A, the CKV is fed to the frequency determination device in the second stage, after REF period calibration in the first stage. The CKV period is achieved through multiple measurements (captures) and averaging (over periods represented in one capture and over time). Estimated frequency ratios and corresponding errors $(N-\hat{N})/N$ are plotted in FIG. 6A for different supply voltages.

Plots (a), (c), (e) are for supply voltages of 0.80V, 0.72V, 0.88V, respectively, and represent estimated frequency ratios (solid lines) compared to actual frequency ratios (dotted lines) as a function of number of captures used (x-axis scale ranging from 0 to 90). The scale of the y-axis ranges from 20.15 to 20.40 in plot (a), from 20.30 to 20.75 in plot (c), and from 20.24 to 20.33 in plot (e).

Plots (b), (d), (f) are for supply voltages of 0.80V, 0.72V, 0.88V, respectively, and represent estimated corresponding errors $(N-\hat{N})/N$ as a function of number of captures used (x-axis scale ranging from 0 to 90). The scale of the y-axis ranges from −0.30% to 0.60% in plot (b), from −2.00% to 0.50% in plot (d), and from 0.05% to 0.45% in plot (f).

As indicated by FIG. 6A, the accuracy of the FLL is generally better than 1%. Hence, it can be used to lock the digital PLL to the correct reference frequency multiple. That the error does not converge to zero may be due to quantization noise when during the first stage.

It can also be seen for this example, that averaging is not necessary for a division ratio of approximately 20 (requiring approximately 2.5% accuracy). Hence, in such a case, the FLL may quickly lock the system at the correct frequency.

In relation to FIG. 6B, the CKV is fed to the frequency determination device in the second stage, after REF period calibration in the first stage. The CKV period is achieved through a single measurement (capture) and averaging (over periods represented in one capture).

Estimated frequency ratios and corresponding errors $(N-\hat{N})/N$ are illustrated through the histograms of FIG. 6B for different supply voltages.

Plots (a), (b), (c) are for supply voltages of 0.80V, 0.72V, 0.88V, respectively, and represent—for a number of error values $(N-\hat{N})/N$—the number of attempts out of 165 attempts that resulted in that error. In plot (a), one delay cell corresponds to an error of 0.35714% (the length of the entire TDC chain corresponds to that of 144 delay cells), the occurring error values are shown for an x-axis ranging from 0 to 0.6 with corresponding number of occurrences shown for an y-axis ranging from 0 to 90. In plot (b), one delay cell corresponds to an error of 0.42644%, the occurring error values are shown for an x-axis ranging from −0.1 to 0.5 with corresponding number of occurrences shown for an y-axis ranging from 0 to 60. In plot (c), one delay cell corresponds to an error of 0.31348%, the occurring error values are shown for an x-axis ranging from −0.3 to 0.6 with corresponding number of occurrences shown for an y-axis ranging from 0 to 50.

As indicated by FIG. 6B, the accuracy of the FLL is generally better than 0.5%. Hence, it can be used to lock the digital PLL to the correct reference frequency multiple.

As mentioned before, embodiments enable that a digital PLL can be operated as an FLL until the frequency is close to the desired CKV frequency. Then, phase locking can be performed to achieve low phase noise. To further enhance the accuracy of the proposed technique, MUX delays can be estimated and accounted for.

Plot (d) is for Monte-Carlo simulations performed for a single-ended TDC (which may be beneficial to lower power consumption) with added estimates of the layout parasitics to account for the delay degradation due to layout, and represent—for a number of error values (N−$\hat{N}$)/N—the number of attempts out of 164 attempts that resulted in that error. In plot (d), one delay cell corresponds to an error of 0.32573%, the occurring error values are shown for an x-axis ranging from −0.3 to 0.4 with corresponding number of occurrences shown for an y-axis ranging from 0 to 70. As shown in plot (d), the error including mismatch is still below 0.5%.

The situation illustrated by plot (e) corresponds to the situation of plot (d), but with a CKV period of 5 GHz (to show that the approaches presented herein works well even if the CKV period is larger than the range of one constituent TDC). The constituent TDC range is 116 ps, so the CKV period of 200 ps can be detected using at least two consecutive constituent TDC:s. Plot (e) represents—for a number of error values (N−$\hat{N}$)/N—the number of attempts out of 164 attempts that resulted in that error. In plot (e), one delay cell corresponds to an error of 0.32573%, the occurring error values are shown for an x-axis ranging from −0.3 to 0.6 with corresponding number of occurrences shown for an y-axis ranging from 0 to 40. As shown in plot (e), the accuracy of detection is still below 0.6%.

Figure 7:
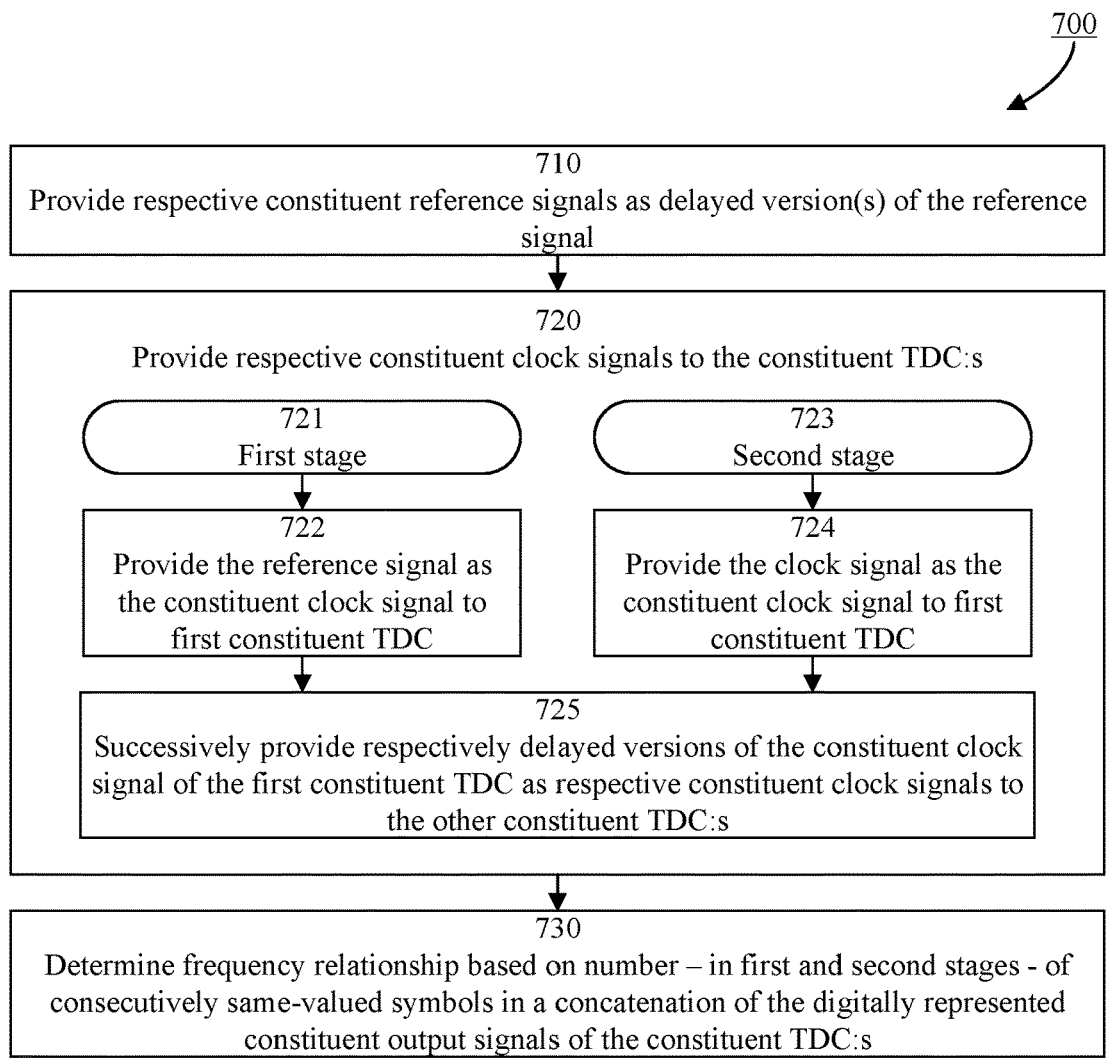
FIG. 7 is a flowchart illustrating example method steps according to some embodiments.

FIG. 7 illustrates an example method 700 according to some embodiments. The method is for determining a frequency relationship between a reference signal and a clock signal. The method may be carried out in analogy with any of the approaches described earlier herein (e.g., in connection with FIGS. 1-3). Features explained in connection with any of the approaches described earlier herein may be equally applicable in the context of the method 700, even if not explicitly mentioned in the context thereof.

In step 710, respective constituent reference signals are provided to each of a plurality of delay-line based) constituent time-to-digital converters (TDC:s). Each respective constituent reference signal comprises a delayed version of the reference signal.

As described earlier, each constituent TDC is configured to provide a digitally represented constituent output signal in response to receiving the constituent reference signal and a constituent clock signal.

In step 720 (which is typically performed in parallel with step 710), the constituent clock signals are provided to the constituent TDC:s.

In a first stage (represented by 721), the reference signal is provided as the constituent clock signal to the first constituent TDC (illustrated by sub-step 722), in a second stage (represented by 723), the clock signal (e.g., a PLL/FLL feedback signal) is provided as the constituent clock signal to the first constituent TDC (illustrated by sub-step 724).

Step 720 also comprises (in the first stage and in the second stage) successively providing respectively delayed versions of the constituent clock signal of the first constituent TDC as respective constituent clock signals to the other constituent TDC:s (illustrated by sub-step 725).

In step 730 (which is typically performed after completing the first and second stages), the frequency relationship is determined based on a number of consecutively same-valued symbols in a concatenation of the digitally represented constituent output signals of the constituent TDC:s determined during the first stage and a number of consecutively same-valued symbols in the concatenation of the digitally represented constituent output signals of the constituent TDC:s determined during the second stage.

Figure 8:
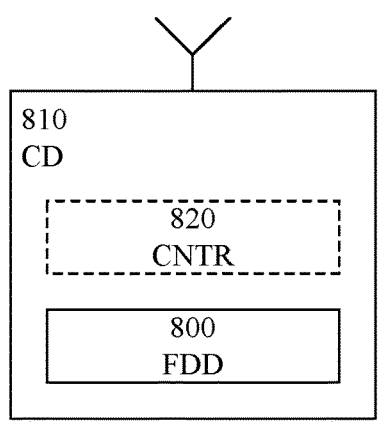
FIG. 8 is a schematic block diagram illustrating an example communication device according to some embodiments.

FIG. 8 schematically illustrates an example communication device (CD) 810 according to some embodiments. The communication device 810 may, for example, be a wireless communication device or a wired communication device. Example communication devices include a receiver, a transmitter, a transceiver, a user equipment (UE), a station (STA), and a radio access node (e.g., a base station, access point or other network node).

The communication device 810 comprises a frequency determination device (FDD) 800, which may be any of the frequency determination device described herein (e.g., 100 of FIG. 1 or 300 of FIG. 3). Optionally, the communication device 810 may also comprise a controller (CNTR) 820 for controlling the FDD 800 (e.g., selecting an operational mode and/or providing time delay for the reference signal).

Some embodiments present a frequency determination device which is based on a TDC architecture that uses serial delay-lines.

The described embodiments and their equivalents may be realized in hardware, or a combination of hardware and software. The embodiments may be performed by general purpose circuitry and/or by specialized circuitry. For example, the digital signal combiner and/or the frequency determiner and/or the reference signal provider may be (partly or fully) implemented using general purpose circuitry and/or software. Alternatively or additionally, the constituent TDC:s and/or the digital signal combiner and/or the frequency determiner and/or the reference signal provider may be (partly or fully) implemented using specialized circuitry.

Examples of general purpose circuitry include digital signal processors (DSP), central processing units (CPU), co-processor units, field programmable gate arrays (FPGA) and other programmable hardware.

Examples of specialized circuitry include application specific integrated circuits (ASIC), delay elements (with fixed or variable delay), multiplexers, flip-flop circuitry, and switches.

The general purpose circuitry and/or the specialized circuitry may, for example, be associated with or comprised in an apparatus such as a transmitter, a receiver, a wireless communication device, or a network node.

Embodiments may appear within an electronic apparatus (such as a transmitter, a receiver, a wireless communication device, or a network node) comprising arrangements, circuitry, and/or logic according to any of the embodiments described herein. Alternatively or additionally, an electronic apparatus (such as a transmitter, a receiver, a wireless communication device, or a network node) may be configured to perform methods according to any of the embodiments described herein.

Generally, all terms used herein are to be interpreted according to their ordinary meaning in the relevant technical field, unless a different meaning is clearly given and/or is implied from the context in which it is used.

Reference has been made herein to various embodiments. However, a person skilled in the art would recognize numerous variations to the described embodiments that would still fall within the scope of the claims.

For example, the partition of functional blocks into particular units is by no means intended as limiting. Contrarily, these partitions are merely examples. Functional blocks described herein as one unit may be split into two or more units. Furthermore, functional blocks described herein as being implemented as two or more units may be merged into fewer (e.g. a single) unit.

Any feature of any of the embodiments disclosed herein may be applied to any other embodiment, wherever suitable. Likewise, any advantage of any of the embodiments may apply to any other embodiments, and vice versa.

Hence, it should be understood that the details of the described embodiments are merely examples brought forward for illustrative purposes, and that all variations that fall within the scope of the claims are intended to be embraced therein.

The invention claimed is:

1. A frequency determination device for determining a frequency relationship between a reference signal and a clock signal, the frequency determination device comprising:
a plurality of constituent time-to-digital converters, TDC:s, each constituent TDC being configured to provide a digitally represented constituent output signal in response to receiving a constituent reference signal and a constituent clock signal, the frequency determination device being configured to successively provide respectively delayed versions of the constituent clock signal of a first constituent TDC as respective constituent clock signals to the other constituent TDC:s;
a reference signal provider configured to provide the respective constituent reference signals to each of the constituent TDC:s, each respective constituent reference signal comprising a delayed version of the reference signal;
switching circuitry configured to provide the reference signal as the constituent clock signal to the first constituent TDC during a first stage, and to provide the clock signal as the constituent clock signal to the first constituent TDC during a second stage; and
determination circuitry configured to determine a number of consecutively same-valued symbols in a concatenation of the digitally represented constituent output signals of the constituent TDC:s, and to determine the frequency relationship based on the number determined during the first stage and the number determined during the second stage.

2. The frequency determination device of claim 1, wherein the reference signal provider is configured to provide the delayed version of the reference signal with an equal delay for each respective constituent reference signal.

3. The frequency determination device of claim 1, wherein the reference signal provider comprises one or more reference signal delay components of equal delay connected in series for providing the delayed version of the reference signal, wherein each of the reference signal delay components corresponds to one or more clock signal delay components configured to provide the respective constituent clock signals to the constituent TDC:s, and wherein the determination circuitry is further configured to determine the delay of a reference signal delay component based on a number of initial consecutively same-valued symbols in the concatenation of the digitally represented constituent output signals during the first stage.

4. The frequency determination device of claim 3, wherein the determination circuitry is configured to determine the frequency relationship further based on the determined delay of a reference signal delay component.

5. The frequency determination device of claim 1, wherein the reference signal provider is configured to provide the delayed version of the reference signal by successively increasing the delay for each respective constituent reference signal.

6. The frequency determination device of claim 1, wherein the reference signal provider comprises a plurality of reference signal delay components, wherein at least some of the reference signal delay components correspond to respective clock signal delay components configured to provide the respective constituent clock signals (to the constituent TDC:s, and wherein—for each respective constituent reference signal—a respective subset of the plurality of reference signal delay components, connected in series, is configured to provide the delayed version of the reference signal.

7. The frequency determination device of claim 1, wherein the frequency relationship is a ratio between the reference signal frequency and the clock signal frequency.

8. The frequency determination device of claim 1, wherein the determination circuitry is configured to determine the frequency relationship as a multiplicity between the number of consecutively same-valued symbols determined during the first stage and the number of consecutively same-valued symbols determined during the second stage.

9. The frequency determination device of claim 1, wherein the switching circuitry is further configured to provide the reference signal as the constituent clock signal to the first constituent TDC during a first part of the first stage, and to provide an inverted version of the reference signal as the constituent clock signal to the first constituent TDC during a second part of the first stage.

10. The frequency determination device of claim 1, wherein the number of consecutively same-valued symbols is an average number of consecutively same-valued symbols in the concatenation of the digitally represented constituent output signals.

11. The frequency determination device of claim 1, wherein the number of consecutively same-valued symbols is exclusive of initial and/or terminal consecutively same-valued symbols in the concatenation of the digitally represented constituent output signals.

12. The frequency determination device of claim 1, wherein each constituent TDC comprises a plurality of delay elements arranged in sequence to successively delay the constituent clock signal, and a corresponding plurality of output ports, wherein each output port is configured to— when triggered by the constituent reference signal—provide an output of one of the delay elements as a symbol of the digitally represented constituent output signal.

13. A time-to-digital converter, TDC, circuitry for converting a phase difference between an input reference signal and an input clock signal to a digitally represented output signal, the TDC circuitry comprising:
a frequency determination device for determining a frequency relationship between a reference signal and a clock signal, the frequency determination device comprising:
a plurality of constituent time-to-digital converters, TDC:s, each constituent TDC being configured to provide a digitally represented constituent output signal in response to receiving a constituent reference signal and a constituent clock, the frequency determination device being configured to successively provide respectively delayed versions of the constituent clock signal of a first constituent TDC as respective constituent clock signals to the other constituent TDC:s;

a reference signal provider configured to provide the respective constituent reference signals to each of the constituent TDC:s, each respective constituent reference signal comprising a delayed version of the reference signal;

switching circuitry configured to provide the reference signal as the constituent clock signal to the first constituent TDC during a first stage, and to provide the clock signal as the constituent clock signal to the first constituent TDC during a second stage; and determination circuitry configured to determine a number of consecutively same-valued symbols in a concatenation of the digitally represented constituent output signals of the constituent TDC:s, and to determine the frequency relationship based on the number determined during the first stage and the number determined during the second stage; and the reference signal being the input reference signal, and the clock signal is the input clock signal, each constituent TDC being further configured to convert a phase difference between the constituent reference signal and the constituent clock signal to the digitally represented constituent output signal.

14. The TDC circuitry of claim 13, wherein the reference signal provider is configured to provide—in at least a parallel operation mode of the TDC circuitry—the respective constituent reference signals to each of the constituent TDC:s with different respective delays for at least two of the respective constituent reference signals.

15. The TDC circuitry of claim 13, wherein the reference signal provider is configured to provide—in at least the parallel operation mode of the TDC circuitry—the respective constituent reference signals as respectively delayed versions of the input reference signal with the respective delays being randomly distributed.

16. The TDC circuitry of claim 13, wherein—in the parallel operation mode of the TDC circuitry—the TDC circuitry is configured to provide the input clock signal as the respective constituent clock signal to each of the constituent TDC:s.

17. The TDC circuitry of claim 13, wherein two or more constituent TDC:s are configured to provide respectively delayed versions of the input clock signal.

18. The TDC circuitry of claim 17, wherein—in a serial operation mode of the TDC circuitry—the TDC circuitry is configurable to operate as the frequency determination device.

19. The TDC circuitry of claim 13, further comprising a mode selection signal input configured to control one or more of:
    provision of the respective constituent clock signal, and
    provision of the constituent reference signal.

20. The TDC circuitry of claim 13, wherein the TDC circuitry is comprised in a phased locked loop.

21. The frequency determination device of claim 1, wherein the frequency determination device is comprised in a frequency locked loop.

22. The frequency determination device of claim 21, wherein the reference signal is an input signal of the frequency-locked loop and the clock signal is a feedback signal of the frequency-locked loop.

23. The frequency determination device of claim 1, wherein the frequency determination device is comprised in an analog to digital converter, ADC, wherein the ADC includes a voltage controlled oscillator.

24. The TDC circuitry of claim 13, wherein the TDC circuitry is comprised in a frequency locked loop.

25. A method for determining a frequency relationship between a reference signal and a clock signal, the method comprising:
    providing respective constituent reference signals to each of a plurality of constituent time-to-digital converters, TDC:s, each respective constituent reference signal comprising a delayed version of the reference signal, each constituent TDC being configured to provide a digitally represented constituent output signal in response to receiving the constituent reference signal and a constituent clock signal;
    providing the constituent clock signal to a first constituent TDC, the reference signal being provided as the constituent clock signal during a first stage and the clock signal is provided as the constituent clock signal during a second stage;
    successively providing respectively delayed versions of the constituent clock signal of the first constituent TDC as respective constituent clock signals to the other constituent TDC:s; and
    determining the frequency relationship based on a number of consecutively same-valued symbols in a concatenation of the digitally represented constituent output signals of the constituent TDC:s determined during the first stage and a number of consecutively same-valued symbols in the concatenation of the digitally represented constituent output signals of the constituent TDC:s determined during the second stage.

* * * * *